(12) United States Patent
Sakurai et al.

(10) Patent No.: US 8,134,081 B2
(45) Date of Patent: Mar. 13, 2012

(54) THREE-DIMENSIONAL CIRCUIT BOARD AND ITS MANUFACTURING METHOD

(75) Inventors: Daisuke Sakurai, Osaka (JP); Yoshihiko Yagi, Hyogo (JP)

(73) Assignee: Panasonic Corporation, Osaka (JP)

( * ) Notice: Subject to any disclaimer, the term of this patent is extended or adjusted under 35 U.S.C. 154(b) by 876 days.

(21) Appl. No.: 12/096,255

(22) PCT Filed: Jan. 12, 2007

(86) PCT No.: PCT/JP2007/050283
§ 371 (c)(1),
(2), (4) Date: Jun. 5, 2008

(87) PCT Pub. No.: WO2007/080943
PCT Pub. Date: Jul. 19, 2007

(65) Prior Publication Data
US 2009/0266582 A1 Oct. 29, 2009

(30) Foreign Application Priority Data
Jan. 13, 2006 (JP) .................... 2006-005895
Feb. 2, 2006 (JP) .................... 2006-025446
Feb. 2, 2006 (JP) .................... 2006-025447

(51) Int. Cl.
*H05K 1/03* (2006.01)
(52) U.S. Cl. ............................... 174/256; 174/250
(58) Field of Classification Search ............ 174/250, 174/255, 258; 361/784, 790; 29/832
See application file for complete search history.

(56) References Cited

U.S. PATENT DOCUMENTS

| 6,518,514 | B2 | 2/2003 | Suzuki et al. |
| 6,555,913 | B1 | 4/2003 | Sasaki et al. |
| 6,896,998 | B2 | 5/2005 | Mizukoshi |
| 2005/0168961 | A1* | 8/2005 | Ono et al. .............. 361/784 |
| 2010/0006327 | A1* | 1/2010 | Yu et al. .................. 174/258 |
| 2010/0288540 | A1* | 11/2010 | Honjo et al. ............ 174/255 |

FOREIGN PATENT DOCUMENTS

| JP | 2-132881 | | 5/1990 |
| JP | 02132881 | * | 5/1990 |
| JP | 05-259599 | | 10/1993 |
| JP | 10-12995 | | 1/1998 |
| JP | 2000-040633 | | 2/2000 |
| JP | 2001-144435 | | 5/2001 |
| JP | 2001-156429 | | 6/2001 |
| JP | 2001-252986 | | 9/2001 |
| JP | 2001-274036 | | 10/2001 |

(Continued)

OTHER PUBLICATIONS

Japanese Office Action issued in Japanese Patent Application No. 2006-005895, mailed Jun. 29, 2010.

(Continued)

Primary Examiner — Yuriy Semenenko
(74) Attorney, Agent, or Firm — McDermott Will & Emery LLP

(57) ABSTRACT

A three-dimensional circuit board is formed by comprising a board, a first wiring-electrode group provided on a plurality of steps above the board, and a second wiring-electrode connected to the first wiring-electrode group at least in an altitude direction, in which at least a connecting portion between the first wiring-electrode group and the second wiring-electrode is integrated in a continuously identical shape.

7 Claims, 30 Drawing Sheets

FOREIGN PATENT DOCUMENTS

| | | |
|---|---|---|
| JP | 2002-368418 | 12/2002 |
| JP | 2003-142528 | 5/2003 |
| JP | 2003-186173 | 7/2003 |
| JP | 2003-298210 | 10/2003 |
| JP | 2004-022623 | 1/2004 |
| JP | 2004022623 * | 1/2004 |
| JP | 2004-111769 | 4/2004 |
| JP | 2004-311720 | 11/2004 |
| JP | 2004-349729 | 12/2004 |
| JP | 2005-167135 | 6/2005 |

OTHER PUBLICATIONS

Japanese Office Action issued in Japanese Patent Application No. 2006-025446, mailed Jun. 29, 2010.

Japanese Office Action issued in Japanese Patent Application No. 2006-025447, mailed Jun. 29, 2010.

* cited by examiner

THREE-DIMENSIONAL CIRCUIT BOARD AND ITS MANUFACTURING METHOD

RELATED APPLICATIONS

This application is the U.S. National Phase under 35 U.S.C. §371 of International Application No. PCT/JP2007/050283, filed on Jan. 12, 2007, which in turn claims the benefit of Japanese Application No. 2006-005895, filed on Jan. 13, 2006, Japanese Application No. 2006-025446, filed on Feb. 2, 2006 and Japanese Application No. 2006-025447, filed on Feb. 2, 2006, the disclosures of which Applications are incorporated by reference herein.

TECHNICAL FIELD

The present invention relates to a three-dimensional circuit board for realize three-dimensional wiring of high density, and its manufacturing method.

BACKGROUND ART

Recently, a portable telephone or a personal digital terminal is rapidly developing into a comprehensive information appliance by incorporating various functions. To realize multiple functions in a limited volume, the primary demands are reduction of size and enhancement of performance of various devices such as semiconductor chips. However, even in a highly integrated semiconductor chip, it is now becoming difficult to enhance the performance dramatically in the existing method from the viewpoint of cost and technology.

At the present, therefore, there is a mounting demand for high-density mounting technology for housing devices in a compact size.

For higher integration of devices, evolution from two-dimensional wiring to three-dimensional wiring is demanded to satisfy the requests for fine device wiring. An essential point in development lies in how to form a three-dimensional circuit board at a higher density and in a simpler process.

A conventional art includes a printed circuit board in a three-dimensional circuit board structure generally as shown in FIG. 29A to FIG. 29C (see, for example, patent document 1).

A conventional printed circuit board of laminated structure consisting of four layers is briefly described below.

FIG. 29A to FIG. 29C are partial perspective views showing an essential structure of a conventional printed circuit board of laminated structure consisting of four layers, and its manufacturing method.

First, as shown in FIG. 29A to FIG. 29C, on one side of resin film 4010, for example, three one-sided conductor films 4050, having conductor patterns 4020 formed by printing conductive paste, and conductive vias 4030 having via holes filled with conducive paste, are formed. Lands 4040 are formed on conductor patterns 4020 for allowing a positional deviation from conductive vias 4030 when laminating one-sided conductor films 4050.

As shown in FIG. 29B, three one-sided conductor films 4050 are mounted by adjusting the positions of conductor patterns 4020 and conductive vias 4030. From above and beneath three one-sided conductor films 4050, by heating and pressing by using, for example, a press machine, printed circuit board 4000 of four-layer structure is formed as shown in FIG. 29C.

By photo-forming method, a manufacturing method of a wiring board having a three-dimensional circuit board structure is disclosed (see, for example, patent document 2).

Referring now to FIG. 30 and FIG. 31A to FIG. 31E, a manufacturing method of a wiring board having a three-dimensional circuit board structure by photo-forming method is described below.

FIG. 30 is a sectional view schematically showing a manufacturing apparatus of wiring board, and FIG. 31A to FIG. 31E are sectional views explaining a manufacturing method of wiring board by using the manufacturing apparatus in FIG. 30.

As shown in FIG. 30, manufacturing apparatus 4100 of wiring board has first reserve tank 4120 containing insulating liquid resin 4110, and second reserve tank 4140 containing conductive liquid resin 4130. It also has moving control unit 4180 for moving board 4160 placed on table 4150 alternately between first reverse tank 4120 and second reserve tank 4140. Further, insulating liquid resin 4110 or conductive liquid resin 4130 on board 4160 placed at a specified depth is cured by scanning a specified pattern by using laser irradiation device 4190 for generating an ultraviolet ray or the like, and a specified pattern is formed by photo-forming method.

A specific manufacturing method is explained by referring to FIG. 31A to FIG. 31E.

First, as shown in FIG. 31A, board 4160 is immersed in insulating liquid resin 4110 in first reserve tank 4120, and electric insulating layer 4200 is formed in a specified thickness on the surface of board 4160 by photo-forming method.

Next, as shown in FIG. 31B, board 4160 is immersed in conductive liquid resin 4130 in second reserve tank 4140, and after conductive liquid resin 4130 is flattened to a specified thickness, specified conductor pattern 4210 is formed on electric insulating layer 4200 by photo-forming method. By removing conductive liquid resin 4130 except for conductor pattern 4210, a first layer of conductor pattern 4210 is formed.

As shown in FIG. 31C, board 4160 is immersed in insulating liquid resin 4110 in first reserve tank 4120, and electric insulating layer 4220 is formed in a specified thickness on conductor pattern 4210 of board 4160 by photo-forming method. At this time, light is not emitted to a specified position of insulating liquid resin 4110 on conductor pattern 4210, and insulating liquid resin 4110 is removed, so that via hole 4230 is formed.

As shown in FIG. 31D, board 4160 is immersed in conductive liquid resin 4130 in second reserve tank 4140, and after conductive liquid resin 4130 is flattened to a specified thickness, a second layer of conductor pattern 4240 for covering via hole 4230 is formed on electric insulating layer 4220 by photo-forming method.

Finally, as shown in FIG. 31E, by the same method as mentioned above, electric insulating layer 4230 and a third layer of conductor pattern 4260 are formed on conductor pattern 4240.

In this process, it is explained by a wiring board of multiple layers can be formed at high productivity.

Another example is about forming a three-dimensional structure by photo-forming method by using a liquid crystal mask (see, for example, patent document 3).

According to this method, by using a liquid crystal mask, a three-dimensional shape of a desired structure formed of photosetting resin is integrally formed by a non-laminating layer, and plural components of different shapes can be manufactured at the same time, and it is suited to production of multiple variety and small quantity.

Similarly, by photo-forming method, a manufacturing method of circuit parts by forming an electric circuit pattern in a three-dimensional structure is disclosed (see, for example, patent document 4).

According to the method, as shown in FIG. 32, by photo-forming method, three-dimensional structure 4300 is formed by curing a photosetting resin in layers. Metal plating is formed on the surface, and electric circuit pattern 4310 is formed from the metal plating by using photolithography or etching method. As a result, electric circuit pattern 4310 is formed on three-dimensional structure 4300 in a short time, and circuit parts are obtained.

However, in the printed circuit board in patent document 1, conductor patterns are formed on upper and lower sides of a plurality of resin films, and are connected to conductive vias formed in the resin films, and thereby a laminated board is formed. At this time, in consideration of deviation in connection positions of conductive vias and conductor patterns when laminating the resin films, lands are formed.

As a result, the following problems are caused as shown in FIG. 33A and FIG. 33B.

FIG. 33A and FIG. 33B are schematic diagrams explaining a connected state of conductive vias 4030 and conductor patterns 4020 by way of lands 4040.

That is, as shown in a plan view in FIG. 33B, due to lands 4040 to be connected to conductive vias 4030, conductor patterns 4020 must be disposed by evading the locations of lands 4040, and conductor patterns 4020 cannot be formed at fine pitches.

Besides, since conductor patterns 4020 can be formed only on both side of resin films, three-dimensional wiring of high density is limited.

Since conductive vias 4030 and conductor patterns 4020 are connected by compressing or bonding, due to entry of foreign matter or forming of oxide film on the connection interface, the connection resistance may be increased, or the connection reliability may not be satisfactory. To avoid such troubles, if the interface is processed by etching or the like, the number of processes is increased, and the productivity may be lowered.

When a plurality of resin films are laminated and integrated, due to remaining bubbles or the like, peeling is likely to occur, and the reliability may be inferior.

Similarly, in the wiring board in patent document 2, the conductor patterns and the electric insulating layers are formed by changing over the reserve tanks, the wiring bard of multiple-layer structure can be manufactured easily.

However, in this wiring board, too, since the conductor patterns are larger than the shape of conductive vias, conductor patterns of fine pitches cannot be formed.

Besides, since the conductor patterns are formed on the flatly formed electric insulating layer, conductor patterns cannot be formed at desired positions.

Yet, since the conductor patterns, conductive vias, and electric insulating layers are formed in separate processes in each layer, the productivity is lowered, and the reliability is connection is not satisfactory between layers of conductor patterns and conductive vias.

According to patent document 3, a three-dimensional insulating structure can be manufactured in batch, but nothing specific is disclosed about the electrically connected three-dimensional wiring electrodes.

The circuit parts disclosed in patent document 4 are intended to form electric circuit patterns at specified positions on the surface of a three-dimensional structure.

It is hence difficult to form electric circuit patterns having a three-dimensional structure. Moreover, since the electric circuit patterns are formed by etching, it is difficult to form finely in steps of three-dimensional structure, and the productivity is lower.

Patent document 1: Unexamined Japanese Patent Publication No. 2002-368418
Patent document 2: Unexamined Japanese Patent Publication No. 2004-22623
Patent document 3: Unexamined Japanese Patent Publication No. 2001-252986
Patent document 4: Unexamined Japanese Patent Publication No. 10-12995

DISCLOSURE OF THE INVENTION

The three-dimensional circuit board of the present invention includes a board, a first wiring-electrode group provided on a plurality of steps on the board, and a second wiring-electrode connected to the first wiring-electrode group in an altitude direction, in which at least a connecting portions of the first wiring-electrode group and the second wiring-electrode is composed in an identical shape.

This configuration realizes a three-dimensional circuit board free from land and connection interface, and having a wiring-electrode group consisting of a first wiring-electrode group and a second wiring-electrode of high density and high reliability.

The manufacturing method of three-dimensional circuit board of the present invention forms a first wiring-electrode group having a plurality of steps on a board, and a second wiring-electrode connected to the first wiring-electrode group in an altitude direction, integrally in a continuously identical shape by photo-forming method using a conductive photosetting resin.

This method easily manufactures a three-dimensional circuit board free from land and connection interface, and having a wiring-electrode of high density and high reliability continuously in batch process.

DESCRIPTION OF REFERENCE NUMERALS

Figure 1A:
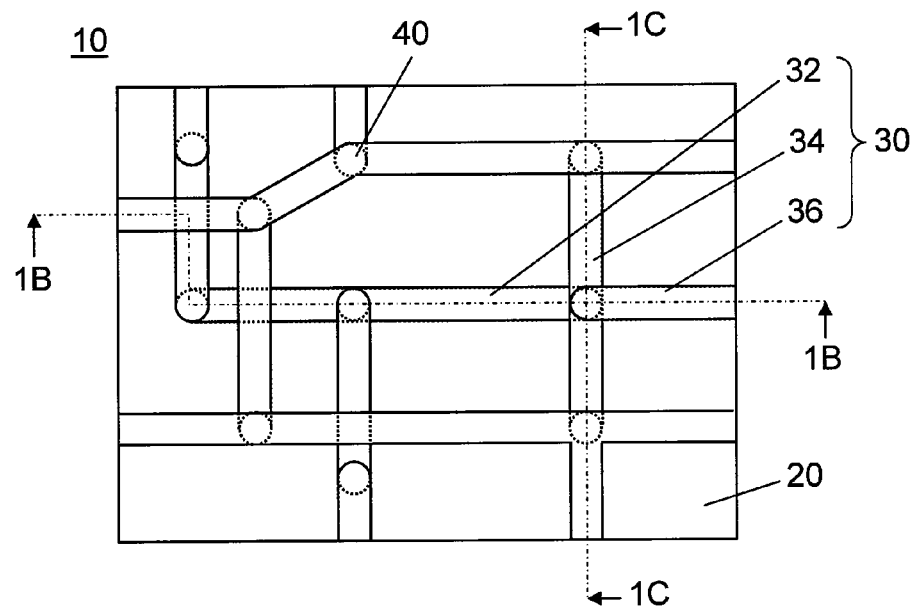
FIG. 1A is a partial plan view schematically showing a three-dimensional circuit board in a first preferred embodiment of the present invention.

10, 60, 80, 200, 280, 300, 400, 480, 500, 600, 700, 800, 880, 900, 980, 2010, 2400 Three-dimensional circuit board 20, 220, 520, 820, 2020, 2420 Board
30, 230, 530, 830, 2030, 2430 First wiring-electrode group
32, 34, 36, 232, 234, 235, 236, 238, 310, 532, 534, 536, 832, 834, 835, 836, 838, 932, 2032, 2034, 2036, 2170, 2175, 2350, 2432, 2434, 2436 First wiring-electrode
40, 242, 244, 540, 842, 844, 2040, 2042, 2340, 2440 Second wiring-electrode
45, 545, 2045, 2445 Connecting portion
50, 250, 350, 550, 850, 2050, 2360, 2450, 4050 Insulating layer
100, 580, 2100 Conductive photosetting resin
110, 2110, 2218, 2510 Container
115, 2226 Light transmission window
120, 2120, 2220, 2520 Table
130, 2202 Light irradiation device
140, 2130, 2530 Irradiation light
150 Scanning mirror
160, 2160, 2222, 2560 Control device
240, 840 Second wiring-electrode group
320 Connection electrode
330, 340 Dummy electrode
410, 910 Semiconductor chip
420, 920 Capacitor
430, 930 Electronic component
510, 810 Metal layer
2140, 2141, 2142.2143, 2144. 2145. 2540 Opening
2150, 2550 Mask
2200, 2250 Photo-forming device
2203 Laser light
2204 Collimator unit
2206, 2208 Polarizer
2210 Pattern forming device
2211 Liquid crystal panel
2212 Lens
2214 Mirror
2216 Objective lens
2224 Control unit
2300 Wafer
2310 Semiconductor chip
2320, 2355 Electrode terminal
2330 Wiring-electrode group
2370 Bump
2410 Metal layer
2429 First wiring resin group
2431, 2433, 2435 First wiring resin
2439 Second wiring resin
2500 Photosetting resin

DETAILED DESCRIPTION OF THE PREFERRED EMBODIMENTS

Referring now to the drawings, preferred embodiments of the present invention are described specifically below.

First Preferred Embodiment

Figure 1B:
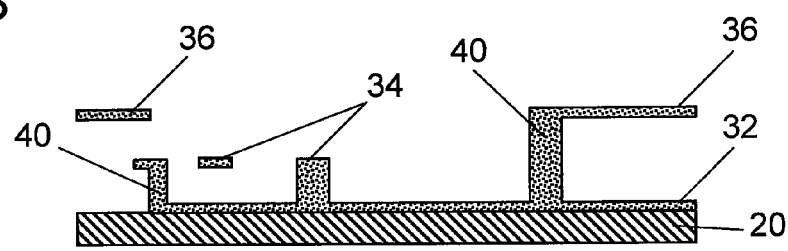
FIG. 1B is a sectional view along line 1B-1B in FIG. 1A.
Figure 1C:
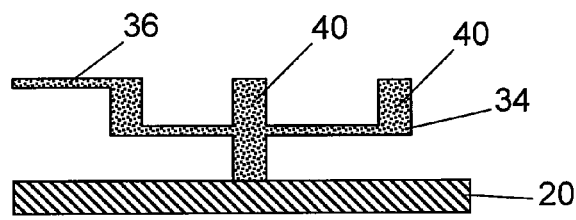
FIG. 1C is a sectional view along line 1C-1C in FIG. 1A.

FIG. 1A is a partial plan view schematically showing a three-dimensional circuit board in a first preferred embodiment of the present invention, FIG. 1B is a sectional view along line 1B-1B in FIG. 1A, and FIG. 1C is a sectional view along line 1C-1C in FIG. 1A.

As shown in FIG. 1A to FIG. 1C, three-dimensional circuit board 10 has a wiring-electrode group formed three-dimensionally by a conductive photosetting resin made of a photosetting resin containing conductive filler such as silver, gold, copper, silver, or palladium particles, provided at least on one side of board 20 made of polyethylene terephthalate (PET), polyethylene naphthalate, polyimide, glass epoxy resin, silicon, or glass. For the ease of understanding of the wiring-electrode group shown in FIG. 1A, the one shown in band shape is called first wiring-electrode group 30, and the other formed in circular shape is called second wiring-electrode 40. Second wiring-electrode 40 has a same action as a conductive via in a conventional wiring board, and first wiring-electrode group 30 formed in a plurality of steps is connected in an altitude (thickness) direction.

In the first preferred embodiment of the present invention, first wiring-electrode group 30 is shown in three steps, for example, consisting of first-step first wiring-electrode 32 corresponding to the lowest step provided in the altitude direction of three-dimensional board 10, second-step first wiring-electrode 34, and third-step first wiring-electrode 36 corresponding to the highest step.

Figure 2A:
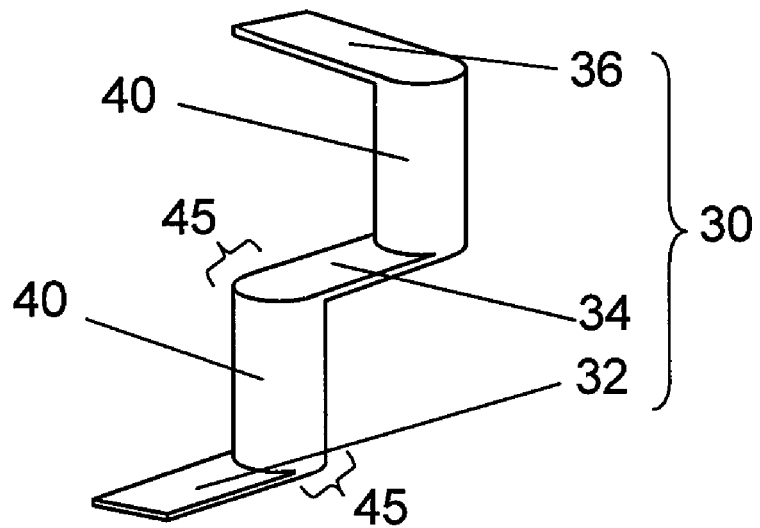
FIG. 2A is a partial perspective view showing a connection state of first wiring-electrode group and second wiring-electrode of the three-dimensional circuit board in the first preferred embodiment of the present invention.
Figure 2B:
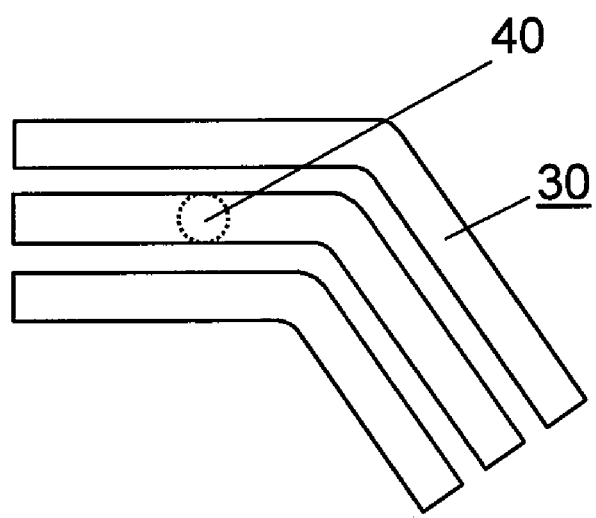
FIG. 2B is a partial plan view explaining the relation between first wiring-electrode group and second wiring-electrode of the three-dimensional circuit board in the first preferred embodiment of the present invention.

Referring now to FIG. 2A and FIG. 2B, the connection state of first wiring-electrode group and second wiring-electrode of the three-dimensional circuit board in the first preferred embodiment of the present invention is schematically described.

FIG. 2A is a partial perspective view showing a connection state of first wiring-electrode group and second wiring-electrode, and FIG. 2B is a partial plan view explaining the positional relation between first wiring-electrode group and second wiring-electrode.

Figure 33A:
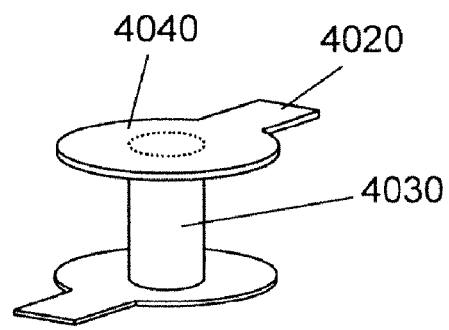
FIG. 33A is a schematic diagram explaining a connected state of conductive vias and conductor patterns by way of lands of wiring board of conventional art.
Figure 33B:
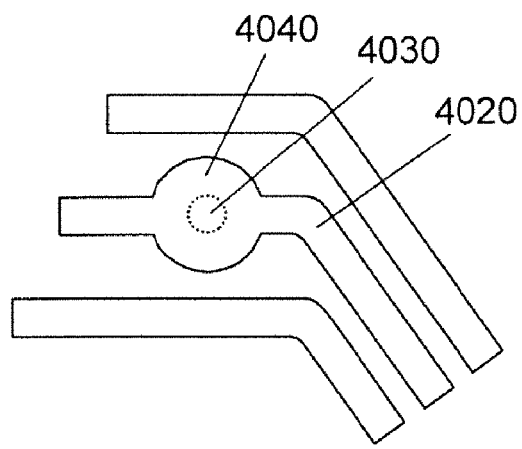
FIG. 33B is a schematic diagram explaining a connected state of conductive vias and conductor patterns by way of lands of wiring board of conventional art.

As shown in FIG. 2A, at least connecting portions 45 between first-step first wiring-electrode 32, and second-step first wiring-electrode 34 are integrated in a continuously identical shape by photo-forming method, by way of second wiring electrode 40, as described specifically in the following manufacturing method. Accordingly, as shown in FIG. 2B, conventional lands 4040 as shown in FIG. 33A and FIG. 33B are not necessary.

That is, according to the first preferred embodiment of the present invention, lands are not needed in connecting portions 45 of second wiring-electrode 40 connecting to the plural steps of the first wiring-electrode group, and each step of first wiring-electrode may be provided at narrow pitches. As a result, three-dimensional circuit board 10 of high density having a three-dimensional wiring-electrode group may be realized.

Unlike the conventional art, not limited to both sides of the resin film, first wiring-electrode group 30 can be formed freely, and first wiring-electrode group 30 can be provided at an arbitrary altitude of three-dimensional circuit board 10. Hence, three-dimensional circuit board 10 of high degree of freedom of design is realized.

Moreover, since first wiring-electrode group 30 and second wiring-electrode 40 are provided integrally and continuously, oxide film is not formed on the interface, for example, between first wiring-electrode group 30 and second wiring-electrode 40, and three-dimensional circuit board 10 small in increase or fluctuation of connection resistance at the interface is realized.

Another examples of three-dimensional circuit board in the first preferred embodiment of the present invention are described by referring to FIG. 3A to FIG. 4C.

Figure 3A:
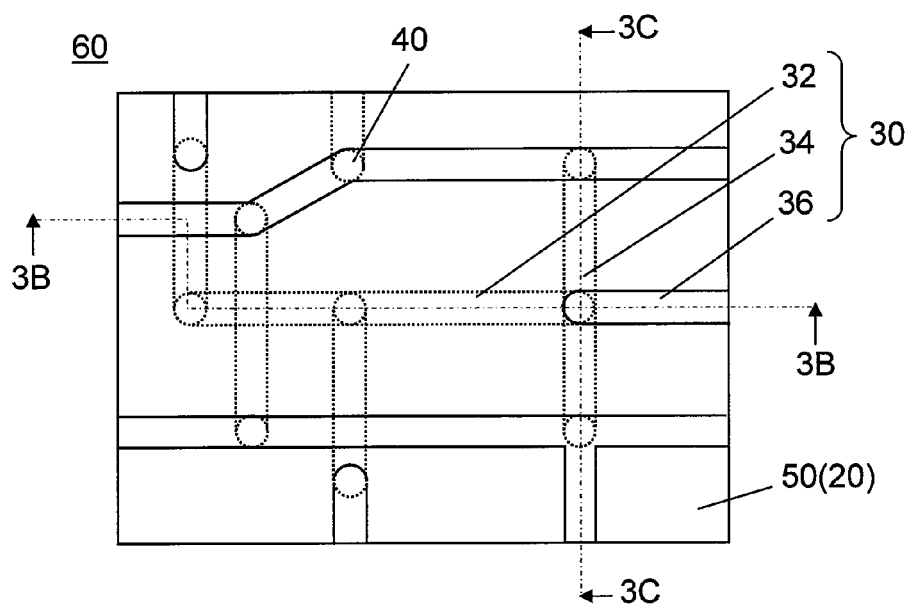
FIG. 3A is a partial plan view showing another example of the three-dimensional circuit board in the first preferred embodiment of the present invention.
Figure 3B:
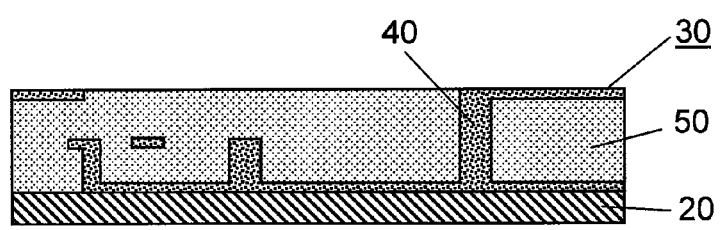
FIG. 3B is a sectional view along line 3B-3B in FIG. 3A.
Figure 3C:
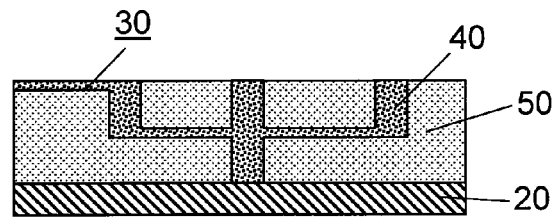
FIG. 3C is a sectional view along line 3C-3C in FIG. 3A.

FIG. 3A is a partial plan view showing another example of the three-dimensional circuit board in the first preferred embodiment of the present invention, FIG. 3B is a sectional view along line 3B-3B in FIG. 3A, and FIG. 3C is a sectional view along line 3C-3C in FIG. 3A.

In FIG. 3A to FIG. 3C, what is different from FIG. 1A to FIG. 1C is that at least insulating layer 50 is provided for burying second wiring-electrode 40 and first wiring-electrodes 32, 34 up to third-step first wiring-electrode 36 corresponding to the highest step.

That is, by photo-forming method, a conductive photosetting resin made of a photosetting resin containing conductive filler such as silver particles is cured on board 20, and a three-dimensional wiring-electrode group is formed by first wiring-electrode group 30 and second wiring-electrode 40, and then other conductive photosetting resin is removed. Further, a thermoplastic resin such as PET, or a thermosetting resin such as epoxy is applied and cured by immersion method or injection method so as to bury second wiring-electrode 40 and first wiring-electrodes 32, 34 at least up to third-step first wiring-electrode 36, and thereby insulating layer 50 is formed. Incidentally, when an electronic component is not mounted, third-step first wiring-electrode 36 may be also buried in insulating layer 50 for enhancing the humidity resistance or reliability.

As a result, first wiring-electrode group 30 and second wiring-electrode 40 wired three-dimensionally are reinforced by insulating layer 50, and the mechanical strength is enhanced, and three-dimensional circuit board 60 enhanced in humidity resistance, environmental resistance, and reliability is realized.

Figure 4A:
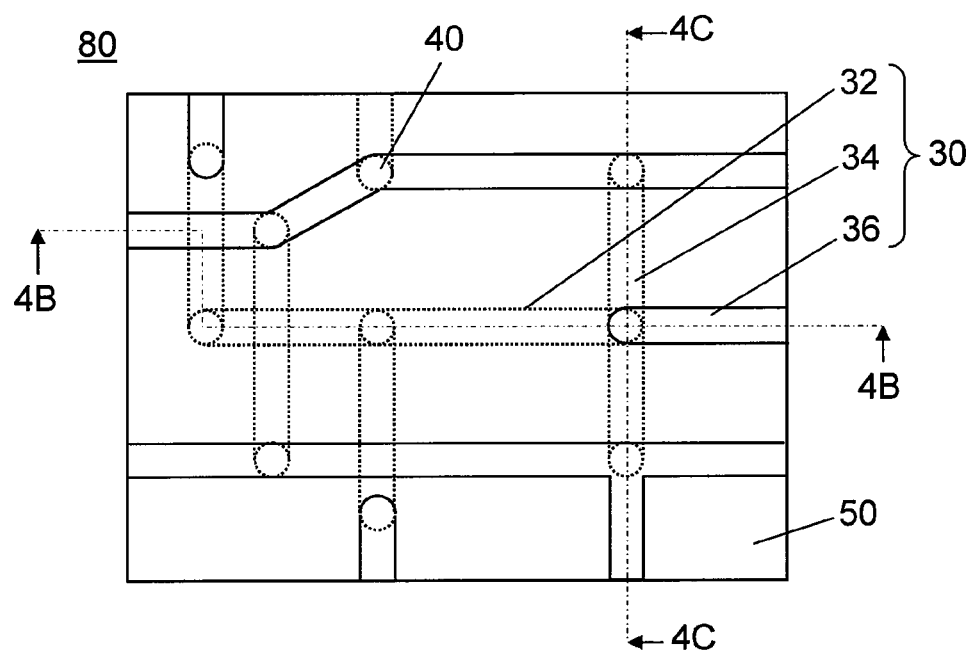
FIG. 4A is a partial plan view showing still another example of the three-dimensional circuit board in the first preferred embodiment of the present invention.
Figure 4B:
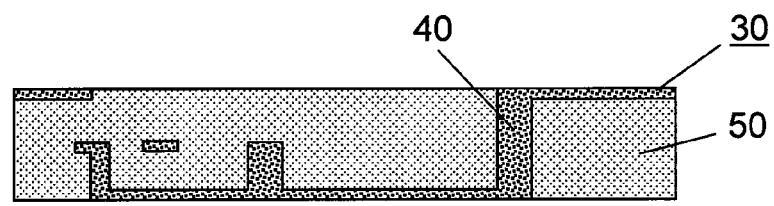
FIG. 4B is a sectional view along line 4B-4B in FIG. 4A.
Figure 4C:
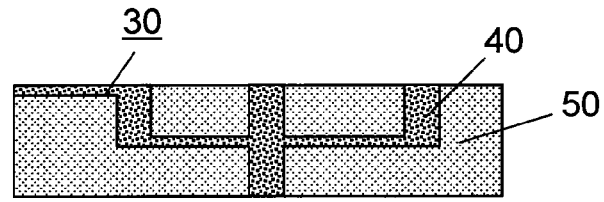
FIG. 4C is a sectional view along line 4C-4C in FIG. 4A.

FIG. 4A is a partial plan view showing another example of the three-dimensional circuit board in the first preferred embodiment of the present invention, FIG. 4B is a sectional view along line 4B-4B in FIG. 4A, and FIG. 4C is a sectional view along line 4C-4C in FIG. 4A.

In FIG. 4A to FIG. 4C, what is different from three-dimensional circuit board 60 in FIG. 3A to FIG. 3C is that board 20 is removed.

That is, three-dimensional circuit board 80 is formed by removing board 20 made of polyethylene terephthalate, polyethylene naphthalate, fluorine resin, or glass, from three-dimensional circuit board 60 of FIG. 3A to FIG. 3C, by using polishing method, etching method, or mechanical peeling method.

As a result, the thickness is reduced, and this three-dimensional circuit board 80 allows an electronic component to be mounted directly on first wiring-electrode group 30 exposed from the upper and lower side of insulating layer 50.

Referring now to FIG. 6A to FIG. 5E, and FIG. 6A to FIG. 6C, a manufacturing method of the three-dimensional circuit board in the first preferred embodiment of the present invention is described. Same component elements as in FIG. 1A to FIG. 1C are identified with same reference numerals.

Figure 5A:
FIG. 5A is a sectional view explaining a manufacturing method of three-dimensional circuit board in the first preferred embodiment of the present invention.
Figure 5B:
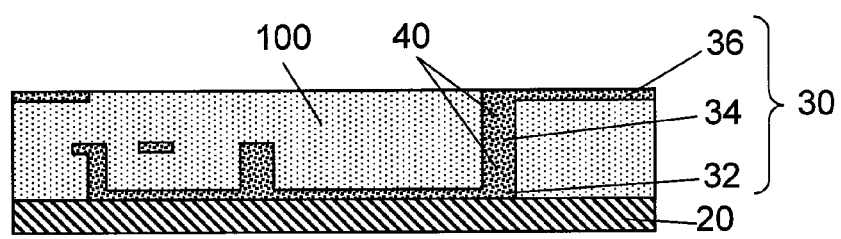
FIG. 5B is a sectional view explaining a manufacturing method of three-dimensional circuit board in the first preferred embodiment of the present invention.
Figure 5C:
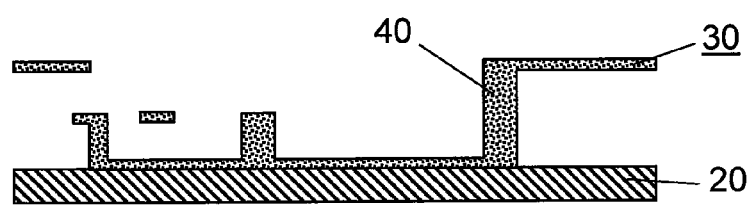
FIG. 5C is a sectional view explaining a manufacturing method of three-dimensional circuit board in the first preferred embodiment of the present invention.
Figure 5D:
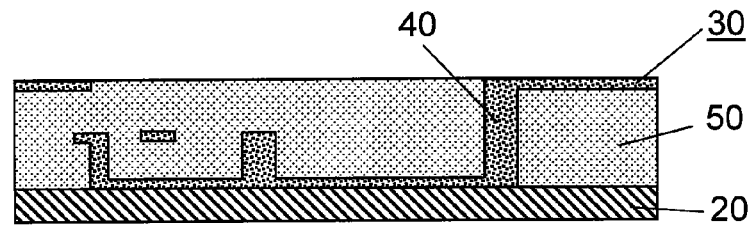
FIG. 5D is a sectional view explaining a manufacturing method of three-dimensional circuit board in the first preferred embodiment of the present invention.
Figure 5E:
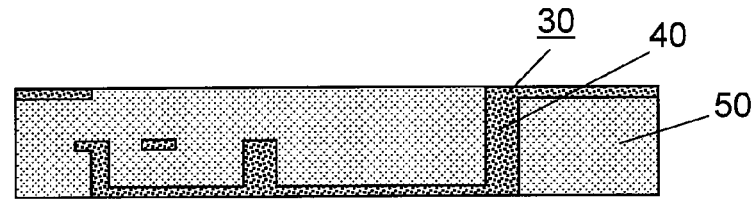
FIG. 5E is a sectional view explaining a manufacturing method of three-dimensional circuit board in the first preferred embodiment of the present invention.
Figure 6A:
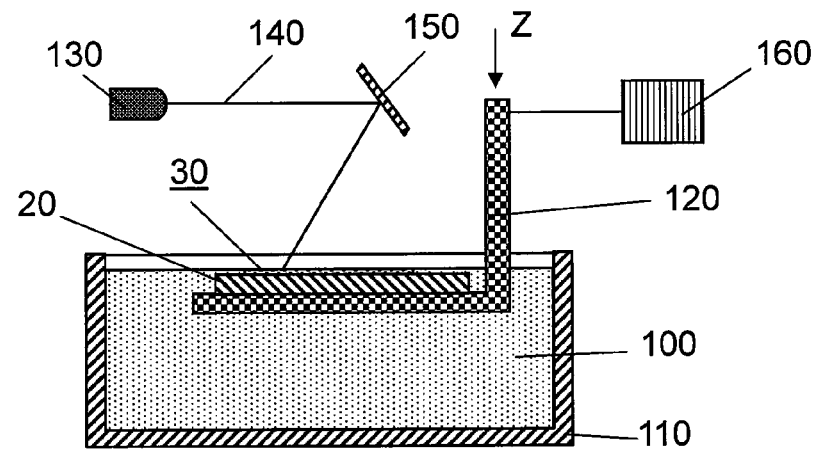
FIG. 6A is a sectional view specifically explaining the process of FIG. 5B of the manufacturing method of three-dimensional circuit board in the first preferred embodiment of the present invention.
Figure 6B:
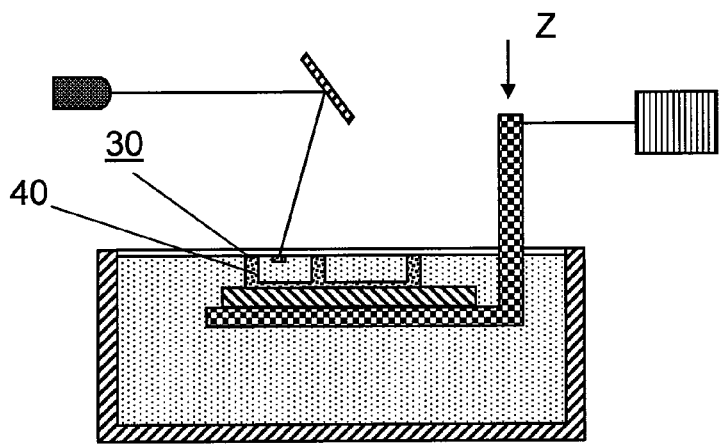
FIG. 6B is a sectional view specifically explaining the process of FIG. 5B of the manufacturing method of three-dimensional circuit board in the first preferred embodiment of the present invention.
Figure 6C:
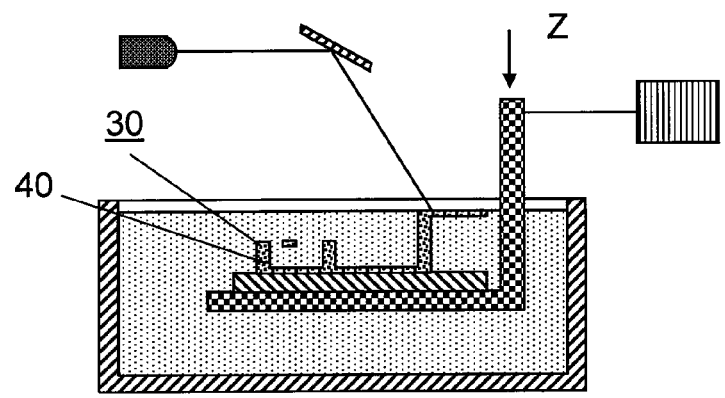
FIG. 6C is a sectional view specifically explaining the process of FIG. 5B of the manufacturing method of three-dimensional circuit board in the first preferred embodiment of the present invention.

FIG. 6A to FIG. 5E are sectional views explaining a manufacturing method of three-dimensional circuit board in the first preferred embodiment of the present invention. FIG. 6A to FIG. 6C are sectional views specifically explaining the process of FIG. 5B.

First, as shown in FIG. 6A, for example, a PET film, a glass epoxy board, or a ceramic board in a thickness of 20 μm to 500 μm is prepared as board 20.

Next, as shown in FIG. 5B, first-step first wiring-electrode 32, second wiring-electrode 40, second-step first wiring-electrode 34, second wiring-electrode 40, and third-step first wiring-electrode 36 are sequentially formed on board 20 by photo-forming method.

Referring now to FIG. 6A to FIG. 6C, a forming method of first wiring-electrode group 30 and second wiring-electrode 40 is specifically explained below.

First, as shown in FIG. 6A, in container 110 filled with photosetting resin of acrylate (hereinafter referred to as "conductive photosetting resin") 100 containing conductive filler such as silver particles, board 20 mounted on table 120 movable at least in Z-direction is immersed.

Conductive photosetting resin 100 on board 20 is irradiated with irradiation light 140 emitted, for example, from light irradiation device 130, and is scanned in a pattern of, for example, first-step first wiring-electrode 32 in X-Y direction by using scanning mirror 150.

Herein, light irradiation device 130 includes argon laser, He—Cd laser, YAG laser, helium-neon laser or semiconductor laser, and high-pressure mercury lamp, xenon lamp, metal halide lamp, tungsten lamp, halogen lamp, or fluorescent lamp, which may be used by focusing by an objective lens.

The photosetting resin of conductive photosetting resin 100 includes resin cured by ultraviolet light or visible light such as urethane acrylate, epoxy, epoxy acrylate, acrylate, or the like. The conductive filler includes, aside from silver particles, a particle such as copper, gold, nickel, or the like in an average particle size of several μm to ten-odd μm, for example, spherical particles. A resin or inorganic filler may be also used.

Next, as shown in FIG. 6B and FIG. 6C, table 120 is sequentially put into conductive photosetting resin 100 while forming first wiring-electrode group 30 and second wiring-electrode 40 in Z-direction. As a result, three-dimensional wiring-electrode group as shown in FIG. 5B is formed in conductive photosetting resin 100. The moving speed of table 120 is synchronized with the intensity, emission time and scanning time of irradiation light 140, and is controlled by control device 160 depending on the shape and size of silver particles of conductive photosetting resin 100. The operation of irradiation light 140 or scanning mirror 150 is controlled on the basis of the three-dimensional wiring-electrode group data input in light irradiation device 130, for example, three-dimensional CAD data. Table 120 may move not only in Z-direction, but also in X-Y direction. In this case, scanning mirror 150 may be fixed.

Figure 7:
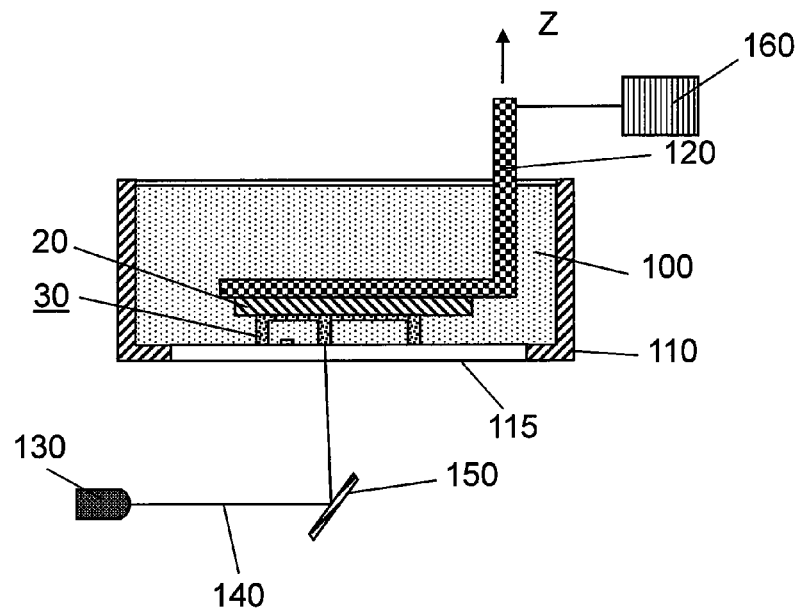
FIG. 7 is a sectional view specifically explaining another process of FIG. 5B of the manufacturing method of three-dimensional circuit board in the first preferred embodiment of the present invention.

In the example above, irradiation light 140 is emitted from the top of container 110, but it is not particularly specified. For example, as shown in FIG. 7, irradiation light 140 may pass the bottom of container 110, that is, light transmission window 115 is formed of quartz or the like, and a three-dimensional wiring-electrode group may be formed while lifting board 20 together with table 120. In this case, conductive photosetting resin 100 may be supplied flatly because it is defined by the bottom of container 110 and board 20. Hence, it is formed in a shorter time as compared with the above embodiment of forming a three-dimensional wiring-electrode group by pulling down the table 120 after flattening by making use of the viscosity of conductive photosetting resin 100.

In this case, the table is moved in X-Y direction, but may be moved only in Z-direction, and a circuit pattern may be formed in batch in every step through a mask opened in a different circuit pattern shape in every step. Further, as the mask, arbitrary patterns may be formed continuously by electric signals, for example, by using a matrix drive type liquid crystal panel.

Consequently, as shown in FIG. 5C, uncured conductive photosetting resin 100 not illuminated with irradiation light 140 is removed by immersing in a solvent or by air blow, and three-dimensional circuit board 10 shown in FIG. 1A to FIG. 1C is fabricated.

Next, as shown in FIG. 5D, three-dimensional circuit board 10 shown in FIG. 5C is immersed in a container (not shown) filled with liquid resin such as imide or acrylic. By curing by cooling or other process, three-dimensional circuit board 60 having insulating layer 50 is fabricated. Insulating layer 50 may be formed by using a resin of epoxy, imide or acrylic, by injecting around the wiring-electrode group by making use of, for example, capillary phenomenon.

Finally, as shown in FIG. 5E, board 20 of three-dimensional circuit board 60 shown in FIG. 5D is removed by, for example, polishing method, etching method, or mechanical peeling method, and three-dimensional circuit board 80 of thin type is fabricated.

As explained herein, according to the manufacturing method of three-dimensional circuit board of the first preferred embodiment of the present invention, a three-dimensional wiring-electrode group composed of first wiring-electrode group and second wiring-electrode can be formed integrally and continuously, and a manufacturing method of high production efficiency can be realized.

Since the first wiring-electrode group and the second wiring-electrode are formed continuously, it is not required to form lands in consideration of deviation of position, and the first wiring-electrode group and the second wiring-electrode can be formed at fine pitches.

Moreover, since the first wiring-electrode group and the second wiring-electrode can be formed by scanning of irradiation light, they can be formed by disposing, for example, at arbitrary positions of the three-dimensional circuit board. As a result, since the forming position of the first wiring-electrode group and the second wiring-electrode is not limited, the three-dimensional circuit board dramatically enhanced in the forming density can be realized.

Further, since the first wiring-electrode group and the second wiring-electrode can be formed continuously, there is no interface between the first wiring-electrode group and the second wiring-electrode. Hence, a three-dimensional circuit board excellent in connection reliability small in increase or fluctuation of connection resistance at interface can be fabricated.

Second Preferred Embodiment

Figure 8A:
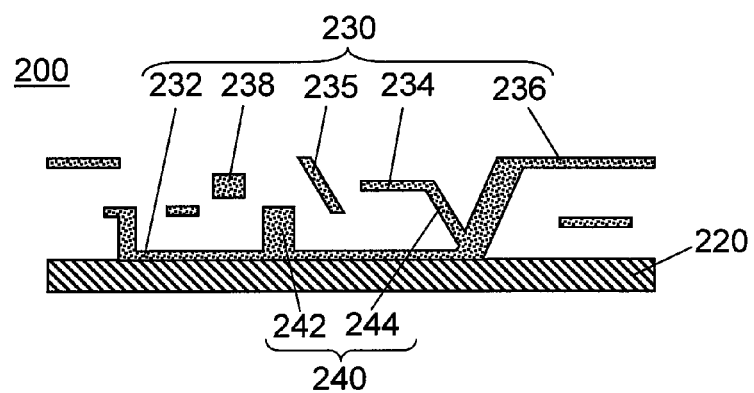
FIG. 8A is a partial sectional view schematically showing a three-dimensional circuit board in a second preferred embodiment of the present invention.
Figure 8B:
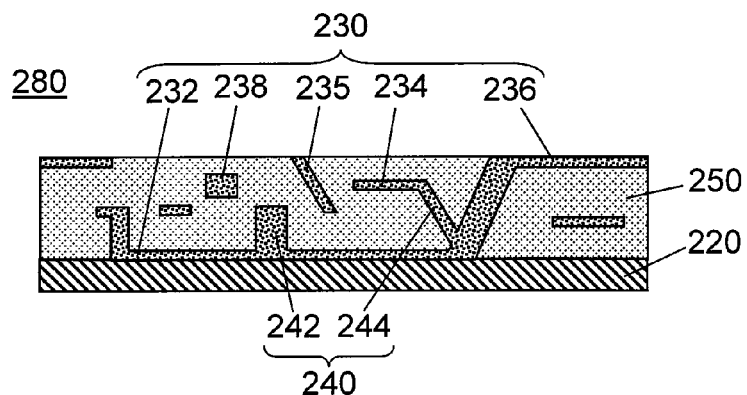
FIG. 8B is a partial sectional view schematically showing another example of three-dimensional circuit board in the second preferred embodiment of the present invention.

FIG. 8A is a partial sectional view schematically showing a three-dimensional circuit board in a second preferred embodiment of the present invention, and FIG. 8B is a partial sectional view schematically showing another example of three-dimensional circuit board in the second preferred embodiment of the present invention.

As shown in FIG. 8A, three-dimensional circuit board 200 in the second preferred embodiment of the present invention differs from three-dimensional circuit board 10 in the first preferred embodiment in that it has first wiring-electrode group 230 composed of first wiring-electrode 235 provided at an arbitrary angle to the horizontal direction of board 220 and first wiring-electrode 238 differing in sectional shape, and second wiring-electrode group 240 composed of second wiring-electrode 244 provided in an oblique direction. Herein, an arbitrary angle to the horizontal direction means that at least a part of the first wiring-electrode group or second wiring-electrode group has a certain angle to the perpendicular direction, and does not mean that the whole part has a certain angle.

That is, first wiring-electrode group 230 is composed of first-step first wiring-electrode 232 corresponding to the lowest step, second-step first wiring-electrode 234, third-step first wiring-electrodes 235, 236 corresponding to the highest step, and first wiring-electrode 238 different in sectional shape. Second wiring-electrode group 240 is composed of second wiring-electrode 242 connecting first wiring-electrode group 230 in vertical direction, and second wiring-electrode 244 connecting in an oblique direction.

By this configuration, for example, first wiring-electrode 235 provided obliquely to the horizontal direction is effective for narrowing the pitch when first wiring-electrode group 230 is wired in narrow gap.

Second wiring-electrode 244 formed obliquely is effective for reducing the wiring resistance because first wiring-electrode group 230 can be connected in a short distance.

In first wiring-electrode 235 provided at an arbitrary angle, and first wiring-electrode 238 and second wiring-electrode (not shown) different in sectional shape, the section shape and sectional area in an arbitrary direction can be changed freely. Accordingly, depending on the required wiring resistance or the like, the wiring-electrode group of three-dimensional circuit board 200 can be freely designed. It is effective, for example, when connecting position with an electronic component at low resistance, or when a filter is composed by wiring resistance and stray capacity or capacity between wiring-electrode groups.

In this explanation, the sectional shape is rectangular, but the present invention is not limited to this example. The shape may be curved shape, spiral shape, polygonal shape, or other arbitrary shape.

Another example of three-dimensional circuit board in the second preferred embodiment of the present invention is described by referring to FIG. 8B.

In FIG. 8B, it is different from three-dimensional circuit board 200 in FIG. 8A in that it also has insulating layer 250 for burying second wiring-electrode group 240 and first wiring-electrodes 232, 234, 238 at least up to third-step first wiring-electrodes 235, 236 corresponding to the highest step.

That is, on board 220, a conductive photosetting resin of photosetting resin containing, for example, silver particles is cured by photo-forming method, and a three-dimensional wiring-electrode group consisting of first wiring-electrode group 230 and second wiring-electrode group 240 is formed, and other conductive photosetting resin is removed. Further, a thermoplastic resin such as PET or a thermosetting resin such as epoxy is applied by immersion method or injection method so as to bury second wiring-electrode group 240 and first wiring-electrodes 232, 234, 238 at least up to third-step first wiring-electrodes 235, 236, and is cured, and thereby insulating layer 250 is formed.

When electronic component is not mounted, for example, in a three-dimensional circuit board or a module board electrically connecting the three-dimensional circuit board, for enhancing the reliability, third-step first wiring-electrodes 235, 236 may be also buried in insulating layer 250.

The manufacturing method of the three-dimensional circuit board in the second preferred embodiment of the present invention is same as the manufacturing method of the three-dimensional circuit board in the first preferred embodiment, and its explanation is omitted.

This method realizes three-dimensional circuit board 280 having first wiring-electrode group 230 and second wiring-electrode group 240 formed at arbitrary angle and in arbitrary shape.

As a result, the first wiring-electrode group and second wiring-electrode group wired three-dimensionally can be reinforced by the insulating layer, and the mechanical strength is enhanced, and a three-dimensional circuit board enhanced in environmental resistance such as humidity resistance, and reliability is realized.

Same as in the first preferred embodiment, by removing board 220 of three-dimensional circuit board 280, a three-dimensional circuit board of thinner type may be realized.

Third Preferred Embodiment

Figure 9A:
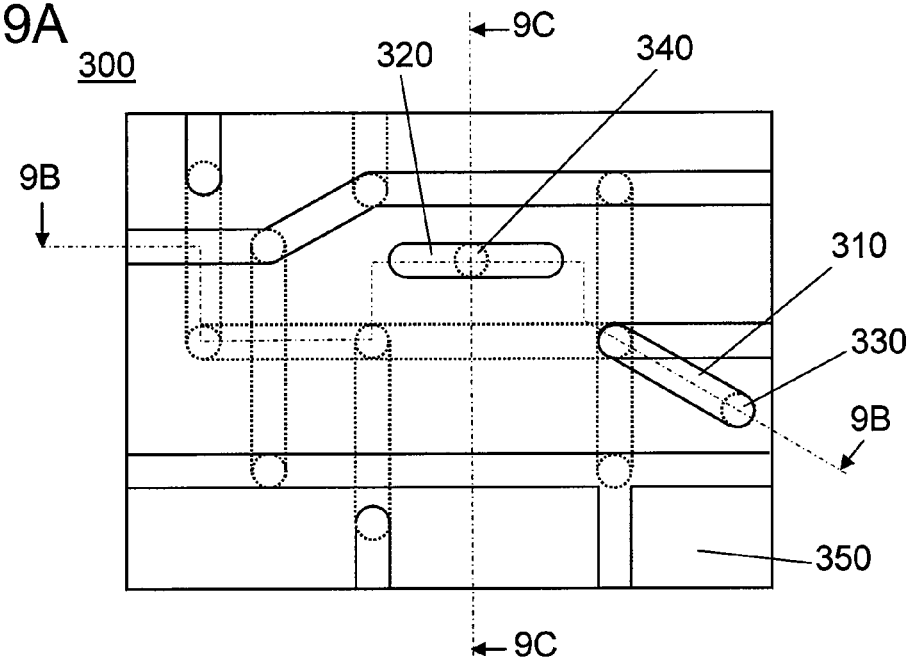
FIG. 9A is a partial plan view schematically showing a three-dimensional circuit board in a third preferred embodiment of the present invention.
Figure 9B:
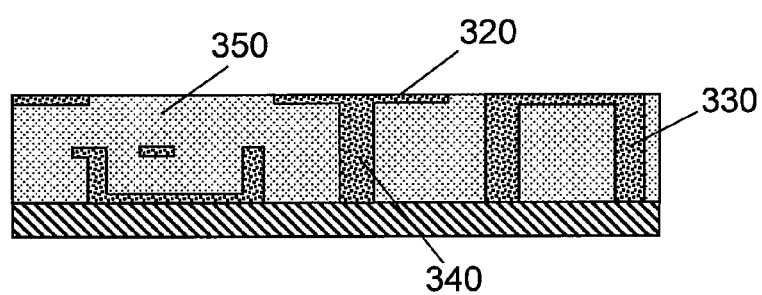
FIG. 9B is a sectional view along line 9B-9B in FIG. 9A.
Figure 9C:
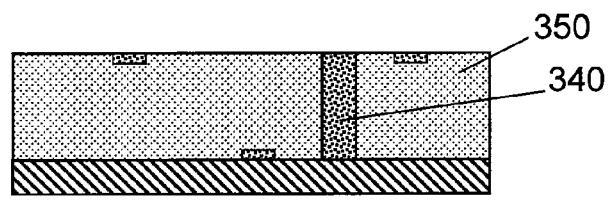
FIG. 9C is a sectional view along line 9C-9C in FIG. 9A.

FIG. 9A is a partial plan view schematically showing a three-dimensional circuit board in a third preferred embodiment of the present invention, FIG. 9B is a sectional view along line 9B-9B in FIG. 9A, and FIG. 9C is a sectional view along line 9C-9C in FIG. 9A.

As shown in FIG. 9A, three-dimensional circuit board 300 is different from three-dimensional circuit board 60 in another example of the first preferred embodiment in that dummy electrodes 330, 340 not connecting with other first wiring-electrode group or second wiring-electrode are provided, for example, in first wiring-electrode 310, in the case of connection electrode 320 formed in a state floating in air, for holding them, when one end is a free end or in a process of forming a three-dimensional wiring-electrode group.

That is, as shown in FIG. 9B, for example, connection electrode 320 for connecting only between the electronic components to be mounted on three-dimensional circuit board 300 is not usually required to be connected to other first wiring-electrode group. Accordingly, when forming connection electrode 320 by photo-forming method, connection electrode 320 is removed simultaneously in a process of removing the uncured conductive photosetting resin. As a result, electronic components may not be connected. Or when mounting electronic components, depending on the location, only the connection terminal of the electronic component may be connected, and one end of first wiring-electrode 310 may be a free end, and the position of this end portion may not be fixed.

Accordingly, to fix the position of connection electrode 320, dummy electrode 340 is formed integrally with connection electrode 320. Similarly, dummy electrode 330 is provided for holding the free end of first wiring-electrode 310, and it is buried in insulating layer 350, and three-dimensional circuit board 300 is composed. Hence, a three-dimensional circuit board enhanced in the degree of freedom of design when mounting electronic components may be realized.

Besides, by eliminating the first wiring-electrode group having a free end, in a process of forming an insulating layer, short-circuiting with other first wiring-electrode group due to deformation of free end may be prevented, and a three-dimensional circuit board of advanced reliability may be realized.

In the above explanation, connection electrode 320 floating in air in the manufacturing process, or first wiring-electrode 310 having a free end is explained, but the invention is not limited to such example. For instance, if the wiring length of first wiring-electrode group is long, and the position cannot be held by the second wiring-electrode, a dummy electrode may be formed at specified position in the second wiring-electrode. As a result, a three-dimensional circuit board of high reliability is realized.

Fourth Preferred Embodiment

Figure 10A:
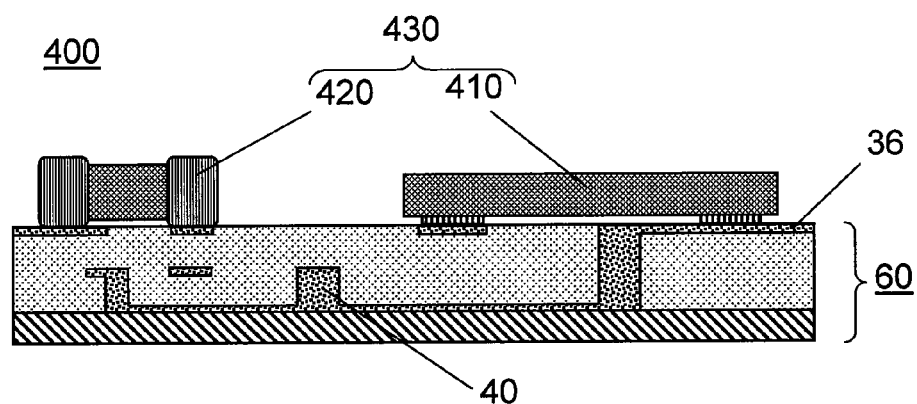
FIG. 10A is a partial sectional view schematically showing a three-dimensional circuit board in a fourth preferred embodiment of the present invention.
Figure 10B:
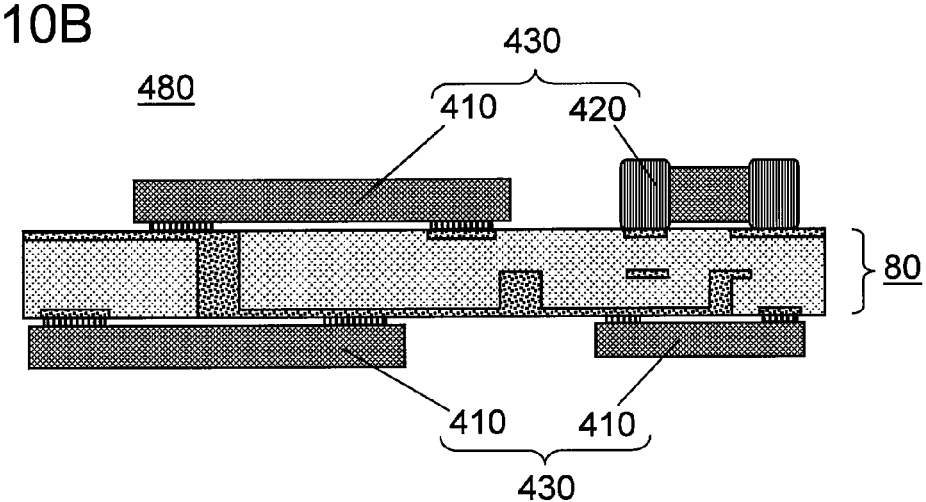
FIG. 10B is a partial sectional view schematically showing another example of three-dimensional circuit board in the fourth preferred embodiment of the present invention.

FIG. 10A is a partial sectional view schematically showing a three-dimensional circuit board in a fourth preferred embodiment of the present invention, and FIG. 10B is a partial sectional view schematically showing another example of three-dimensional circuit board in the fourth preferred embodiment of the present invention.

As shown in FIG. 10A, three-dimensional circuit board 400 is composed by mounting electronic components 430, such as semiconductor chip 410 or chip capacitor 420, on third-step first wiring-electrode 36 corresponding to the highest step in three-dimensional circuit board 60 in the first preferred embodiment.

As shown in FIG. 10B, three-dimensional circuit board 480 is composed by mounting electronic components 430 on the first wiring-electrode groups corresponding to the highest step and lowest step on both sides of three-dimensional circuit board 80 in the first preferred embodiment.

By these configurations, by the wiring-electrode group formed three-dimensionally at high density, the mounting density of electronic components can be enhanced, and a three-dimensional circuit board high in function and multiple in functions may be easily realized.

The fourth preferred embodiment of the present invention may be applied in the three-dimensional circuit boards in the foregoing preferred embodiments. In particular, three-dimensional circuit board 480 in the fourth preferred embodiment is particularly effective in enhancing the mounting density of electronic components.

Fifth Preferred Embodiment

Figure 11A:
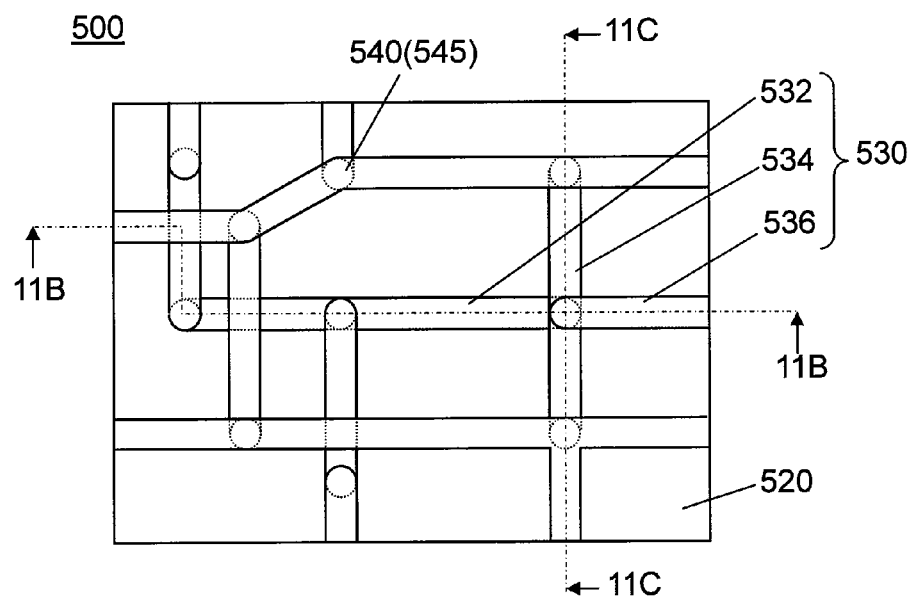
FIG. 11A is a partial plan view schematically showing a three-dimensional circuit board in a fifth preferred embodiment of the present invention.
Figure 11B:
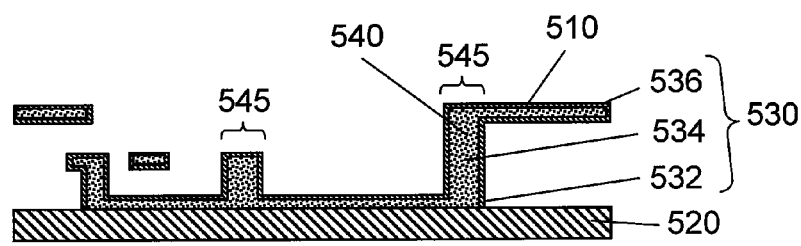
FIG. 11B is a sectional view along line 11B-11B in FIG. 11A.
Figure 11C:
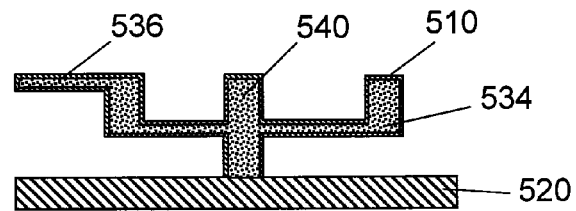
FIG. 11C is a sectional view along line 11C-11C in FIG. 11A.

FIG. 11A is a partial plan view schematically showing a three-dimensional circuit board in a fifth preferred embodiment of the present invention, FIG. 11B is a sectional view along line 11B-11B in FIG. 11A, and FIG. 11C is a sectional view along line 11C-11C in FIG. 11A.

As shown in FIG. 11A to FIG. 11C, three-dimensional circuit board 500 has a wiring-electrode group formed three-dimensionally by a conductive photosetting resin of photosetting resin containing a conductive filler such as silver particles or the like, disposed at least on one side of board 520 formed of, for example, polyethylene terephthalate (PET). On the entire outer surface of the wiring-electrode group, metal layer 510 of gold, silver, or copper is provided by plating or other method.

The fifth preferred embodiment is similar to the first preferred embodiment except that metal layer 510 is provided on the entire surface of the wiring-electrode group.

In the following explanation, for the ease of understanding, the band-shape wiring-electrode group in FIG. 11A is called first wiring-electrode group 530, and the circular one is called second wiring-electrode 540. Second wiring-electrode 540 has the action same as the conductive vias in the conventional circuit board, and plural steps of first wiring-electrode group 530 are connected in an altitude (thickness) direction.

In the fifth preferred embodiment of the present invention, first wiring-electrode group 530 is composed of three steps, that is, first-step first wiring-electrode 532 corresponding to the lowest step provided in an altitude direction of three-dimensional circuit board 500, second-step first wiring-electrode 534, and third-step first wiring-electrode 536 corresponding to the highest step.

In three-dimensional circuit board 500 in the fifth preferred embodiment of the present invention, too, same effects as in the first preferred embodiment explained in FIG. 2 are obtained.

That is, as shown in FIG. 2A, first-step first wiring-electrode 532 and second-step first wiring-electrode 534 are formed continuously and identically at least in the connecting portions 545 by way of second wiring-electrode 540, and therefore the conventionally required lands are not needed as shown in FIG. 2B.

Thus, according to the fifth preferred embodiment of the present invention, by metal layer 510 formed on the entire outer surface of the wiring-electrode group formed three-dimensionally, the wiring resistance can be reduced substantially as compared with the wiring-electrode group formed of conductive photosetting resin only. As a result, three-dimensional circuit board 500 excellent in high frequency properties may be realized.

Moreover, since metal layer 510 is provided on the entire outer surfaced of the wiring-electrode group formed of conductive photosetting resin, the mechanical strength of the wiring-electrode group is enhanced, and a three-dimensional circuit board of high reliability is obtained.

Besides, lands are not needed in connecting portions 545 of second wiring-electrode 540 connecting to the plural steps of the first wiring-electrode group, and each step of first wiring-electrode may be provided at narrow pitches. As a result, three-dimensional circuit board 500 of high density having a three-dimensional wiring-electrode group may be realized.

Unlike the conventional art, not limited to both sides of the resin film, first wiring-electrode group 530 can be formed freely, and first wiring-electrode group 530 can be provided at an arbitrary altitude position of three-dimensional circuit board 500. Hence, three-dimensional circuit board 500 of high degree of freedom of design is realized.

Moreover, since first wiring-electrode group 530 and second wiring-electrode 540 are provided integrally and continuously, oxide film is not formed on the interface, for example, between first wiring-electrode group 530 and second wiring-electrode 540. Hence, three-dimensional circuit board 500 small in increase or fluctuation of connection resistance is realized.

Another examples of three-dimensional circuit board in the fifth preferred embodiment of the present invention are described by referring to FIG. 12A to FIG. 12C, and FIG. 13A to FIG. 13C.

Figure 12A:
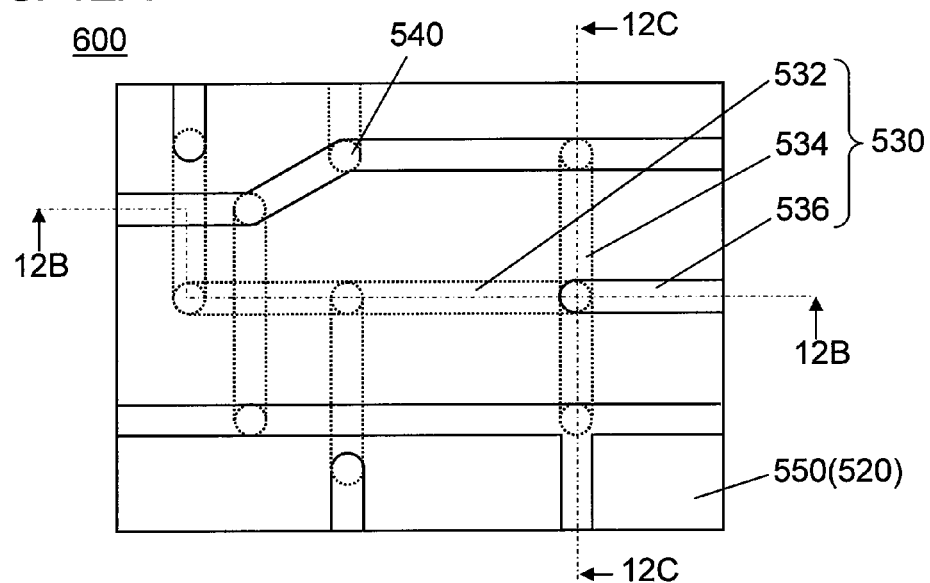
FIG. 12A is a partial plan view schematically showing another example of three-dimensional circuit board in the fifth preferred embodiment of the present invention.
Figure 12B:
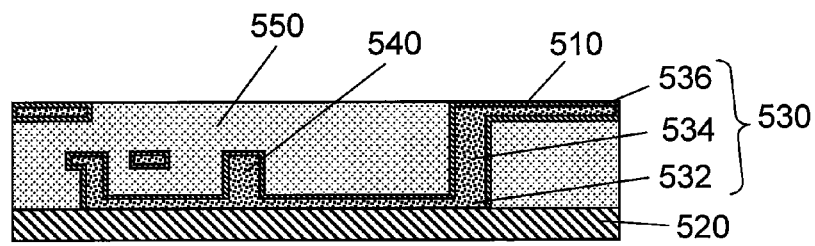
FIG. 12B is a sectional view along line 12B-12B in FIG. 12A.
Figure 12C:
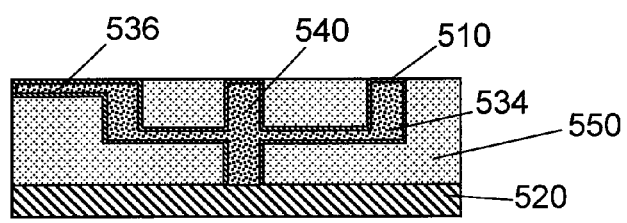
FIG. 12C is a sectional view along line 12C-12C in FIG. 12A.

FIG. 12A is a partial plan view schematically showing another example of three-dimensional circuit board in the fifth preferred embodiment of the present invention, FIG. 12B is a sectional view along line 12B-12B in FIG. 12A, and FIG. 12C is a sectional view along line 12C-12C in FIG. 12A.

In FIG. 12A to FIG. 12C, what is different from FIG. 11A to FIG. 11C is that at least insulating layer 550 is provided for burying second wiring-electrode 540 and first wiring-electrodes 532, 534 up to third-step first wiring-electrode 536 corresponding to the highest step.

That is, by photo-forming method, a conductive photosetting resin made of a photosetting resin containing conductive filler such as silver particles is cured on board 520, and a three-dimensional wiring-electrode group is formed, and then other conductive photosetting resin is removed. On the entire outer surface of the wiring-electrode group, metal layer 510 of gold or the like is formed by plating or other method on first wiring-electrode group 530 and second wiring-electrode 540. Further, a thermoplastic resin such as PET, or a thermosetting resin such as epoxy is applied and cured by immersion method or injection method so as to bury second wiring-electrode 540 and first wiring-electrodes 532, 534 at least up to third-step first wiring-electrode 536, and thereby insulating layer 550 is formed. Incidentally, third-step first wiring-electrode 536 may be also buried in insulating layer 550.

In another example of the fifth preferred embodiment of the present invention, by metal layer 510, three-dimensional circuit board 600 of low wiring resistance is realized. Further by insulating layer 550, first wiring-electrode group 530 and second wiring-electrode 540 wired three-dimensionally are reinforced, and the mechanical strength is enhanced, and three-dimensional circuit board 600 enhanced in environmental resistance such as humidity resistance, and reliability is realized.

Figure 13A:
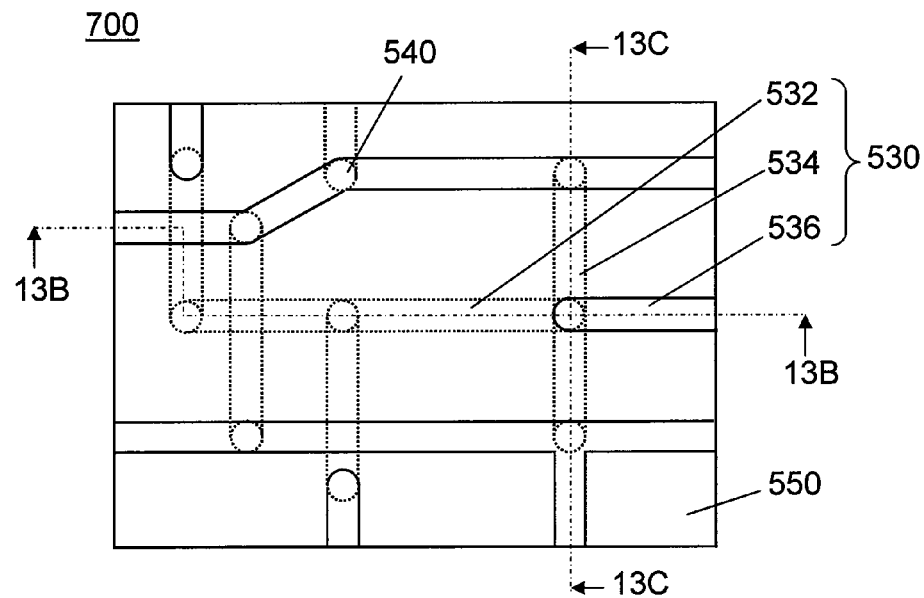
FIG. 13A is a partial plan view schematically showing still another example of three-dimensional circuit board in the fifth preferred embodiment of the present invention.
Figure 13B:
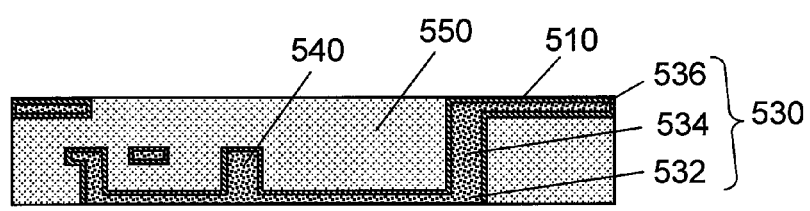
FIG. 13B is a sectional view along line 13B-13B in FIG. 13A.
Figure 13C:
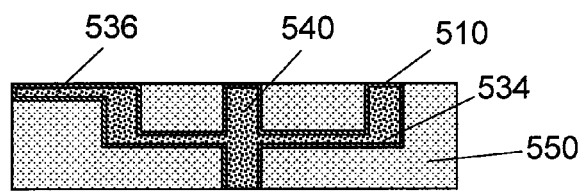
FIG. 13C is a sectional view along line 13C-13C in FIG. 13A.

FIG. 13A is a partial plan view schematically showing still another example of three-dimensional circuit board in the fifth preferred embodiment of the present invention, FIG. 13B is a sectional view along line 13B-13B in FIG. 13A, and FIG. 13C is a sectional view along line 13C-13C in FIG. 13A.

In FIG. 13A to FIG. 13C, what is different from three-dimensional circuit board 600 in FIG. 12A to FIG. 12C is that board 520 is removed.

That is, three-dimensional circuit board 700 is formed by removing board 520, from three-dimensional circuit board 600 of FIG. 12A to FIG. 12C, by using polishing method, etching method, or other method.

As a result, the thickness is reduced, and this three-dimensional circuit board 700 allows an electronic component to be mounted directly on first wiring-electrode group 530 exposed from the upper and lower side of insulating layer 550.

Referring now to FIG. 14A to FIG. 14F, a manufacturing method of the three-dimensional circuit board in the fifth preferred embodiment of the invention is described. Same component elements as in FIG. 11A to FIG. 11C are identified with same reference numerals.

FIG. 14A to FIG. 14F are sectional views explaining a manufacturing method of three-dimensional circuit board in the fifth preferred embodiment of the present invention.

Figure 14A:
FIG. 14A is a sectional view explaining a manufacturing method of three-dimensional circuit board in the fifth preferred embodiment of the present invention.

First, as shown in FIG. 14A, for example, a PET film, a glass epoxy board, or a ceramic board in a thickness of 20 μm to 500 μm is prepared as board 520.

Figure 14B:
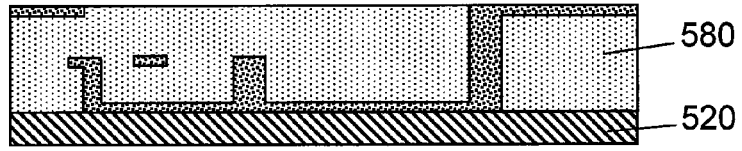
FIG. 14B is a sectional view explaining a manufacturing method of three-dimensional circuit board in the fifth preferred embodiment of the present invention.

Next, as shown in FIG. 14B, first-step first wiring-electrode 532, second wiring-electrode 540, second-step first wiring-electrode 534, second wiring-electrode 540, and third-step first wiring-electrode 536 are sequentially formed on board 520 by photo-forming method.

The forming method of first wiring-electrode group 530 and second wiring-electrode 540 by photo-forming method is same as explained in FIG. 6A to FIG. 6C and FIG. 7 in the first preferred embodiment, and the explanation is omitted.

Figure 14C:
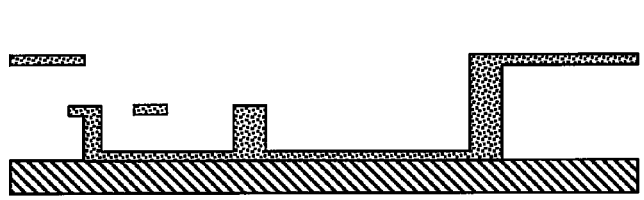
FIG. 14C is a sectional view explaining a manufacturing method of three-dimensional circuit board in the fifth preferred embodiment of the present invention.

Further, as shown in FIG. 14C, by removing uncured conductive photosetting resin 580, for example, by immersing in a solvent or by air blow, three-dimensional circuit board 10 same as explained in FIG. 1A to FIG. 1C is fabricated.

Figure 14D:
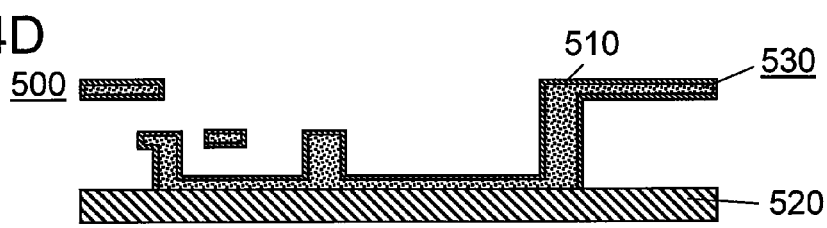
FIG. 14D is a sectional view explaining a manufacturing method of three-dimensional circuit board in the fifth preferred embodiment of the present invention.

As shown in FIG. 14D, for example, gold, silver, nickel or copper is applied by electrolytic plating method or electroless plating method on the entire outer surface of the wiring-electrode group except for the interface of board 520 and first-step first wiring-electrode 532, and metal layer 510 in film thickness of about several units of μm is formed. The film thickness of metal layer 510 may be set freely depending on the concentration of the plating bath, temperature, or current amount.

Metal layer 510 may be formed not only in a single layer, but also in plural layers. For example, when metal layer 510 is silver, by its migration or blackening of silver can be prevented by covering with gold or nickel, together with low wiring resistance, and three-dimensional circuit board 500 of excellent reliability is realized.

Figure 14E:
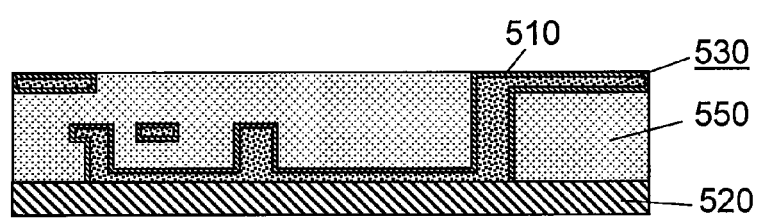
FIG. 14E is a sectional view explaining a manufacturing method of three-dimensional circuit board in the fifth preferred embodiment of the present invention.

Next, as shown in FIG. 14E, three-dimensional circuit board 500 shown in FIG. 14D is immersed in a container (not shown) filled with PET resin or the like, and by curring for about 60 minutes at 120° C., insulating layer 550 is formed.

As a result, the wiring-electrode group formed three-dimensionally is reinforced by insulating layer 550, and three-dimensional wiring board 600 enhanced in humidity resistance and high in reliability is fabricated. Insulating layer 550 may be formed by using a PET resin by injecting into the wiring-electrode group by making use of, for example, capillary phenomenon.

Figure 14F:
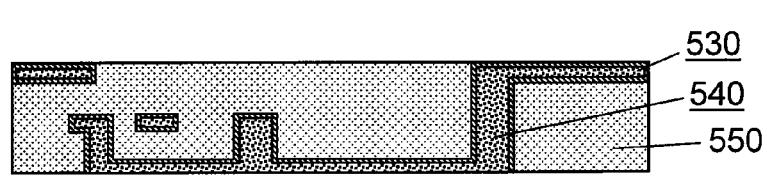
FIG. 14F is a sectional view explaining a manufacturing method of three-dimensional circuit board in the fifth preferred embodiment of the present invention.

Finally, as shown in FIG. 14F, board 520 of three-dimensional circuit board 600 shown in FIG. 14E is removed by, for example, polishing method, etching method, or other method, three-dimensional circuit board 700 of thinner type is fabricated.

As explained herein, the metal layer is provided on the entire surface of the wiring-electrode group, but this is not particularly specified. For example, it may be formed in major part or part of the wiring-electrode group.

According to the manufacturing method of three-dimensional circuit board of the fifth preferred embodiment of the present invention, same effects as in the first preferred embodiment may be obtained, and by the metal layer, a three-dimensional circuit board of excellent mechanical strength and high frequency properties may be realized.

Sixth Preferred Embodiment

Figure 15A:
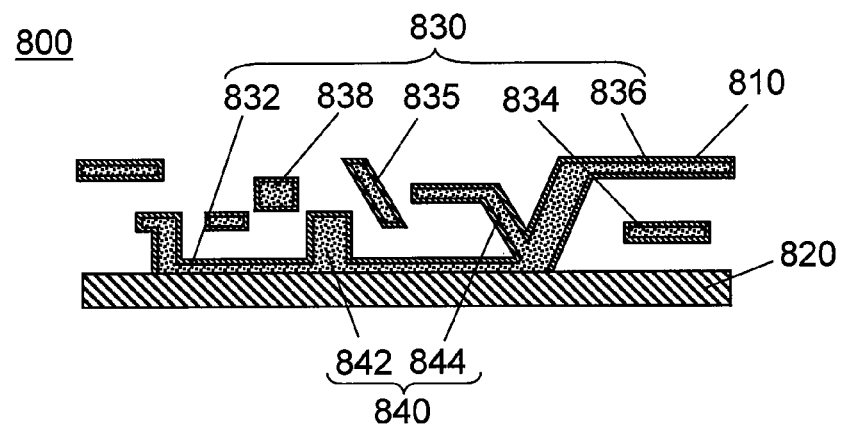
FIG. 15A is a partial sectional view schematically showing a three-dimensional circuit board in a sixth preferred embodiment of the present invention.
Figure 15B:
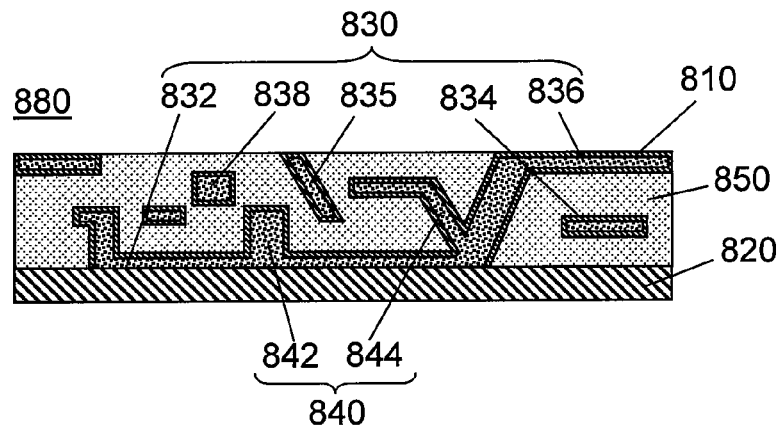
FIG. 15B is a partial sectional view schematically showing another example of three-dimensional circuit board in the sixth preferred embodiment of the present invention.

FIG. 15A is a partial sectional view schematically showing a three-dimensional circuit board in a sixth preferred embodiment of the present invention, and FIG. 15B is a partial sectional view schematically showing another example of three-dimensional circuit board in the sixth preferred embodiment of the present invention.

As shown in FIG. 15A, three-dimensional circuit board 800 in the sixth preferred embodiment of the present invention is different from the second preferred embodiment in that first wiring-electrode group 830 and second wiring-electrode group 840 are composed by forming metal layer 810 on the entire outer surface of the wiring-electrode group formed three-dimensionally in three-dimensional circuit board 200 in the second preferred embodiment.

Herein, first wiring-electrode group 830 is composed of first-step first wiring-electrode 832 corresponding to the lowest step, second-step first wiring-electrode 834, third-step first wiring-electrodes 835, 836 corresponding to the highest step, and first wiring-electrode 838 different in sectional shape. Second wiring-electrode group 840 is composed of second wiring-electrode 842 connecting first wiring-electrode group 830 in vertical direction, and second wiring-electrode 844 connecting in an oblique direction.

As a result, same effects as in the second preferred embodiment are obtained, and three-dimensional circuit board 800 low in wiring resistance and excellent in high frequency characteristics can be realized.

Another example of the three-dimensional circuit board in the sixth preferred embodiment of the present invention is described while referring to FIG. 15B.

In FIG. 15B, it is different from three-dimensional circuit board 800 in FIG. 15A in that insulating layer 850 is provided for burying second wiring-electrode group 840 and first wiring-electrode group 830 at least up to third-step first wiring-electrodes 835, 836 corresponding to the highest step.

Hence, three-dimensional circuit board 880 having first wiring-electrode group 830 and second wiring-electrode group 840 formed at an arbitrary angle and in an arbitrary shape can be realized.

As a result, the first wiring-electrode group and second wiring-electrode group wired three-dimensionally can be reinforced by the insulating layer, and the mechanical strength is enhanced, and three-dimensional circuit board 880 enhanced in environmental resistance such as humidity resistance, and reliability is realized.

Same as in the fifth preferred embodiment, by removing board 820 of three-dimensional circuit board 880, a three-dimensional circuit board of thinner type may be realized.

Seventh Preferred Embodiment

Figure 16A:
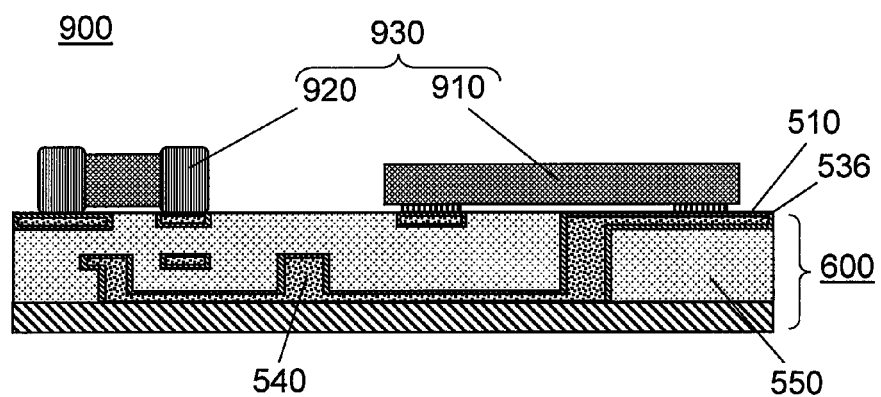
FIG. 16A is a partial sectional view schematically showing a three-dimensional circuit board in a seventh preferred embodiment of the present invention.
Figure 16B:
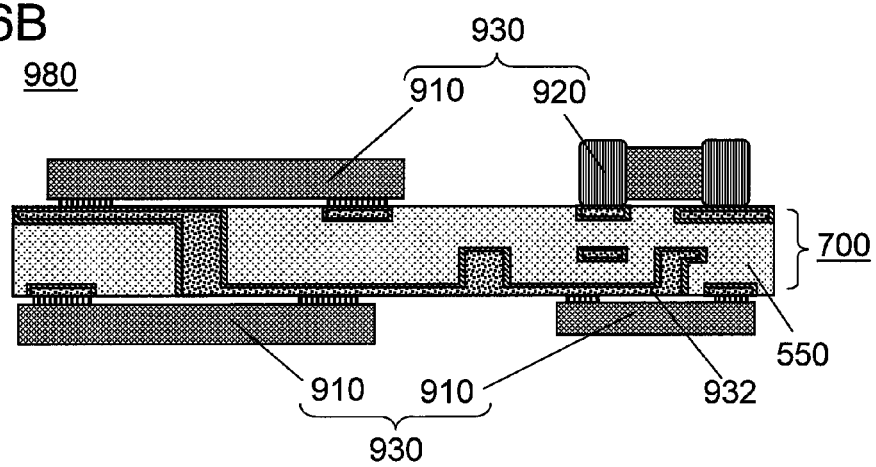
FIG. 16B is a partial sectional view schematically showing another example of three-dimensional circuit board in the seventh preferred embodiment of the present invention.

FIG. 16A is a partial sectional view schematically showing a three-dimensional circuit board in a seventh preferred embodiment of the present invention, and FIG. 16B is a partial sectional view schematically showing another example of three-dimensional circuit board in the seventh preferred embodiment of the present invention.

As shown in FIG. 16A, three-dimensional circuit board 900 is composed by mounting electronic components 930, such as semiconductor chip 910 or chip capacitor 920, on metal layer 510 of third-step first wiring-electrode 536 corresponding to the highest step in three-dimensional circuit board 600 in the fifth preferred embodiment.

As shown in FIG. 16B, three-dimensional circuit board 980 is composed by mounting electronic components 930 on first wiring-electrode groups 530 corresponding to the highest step and lowest step on both sides of three-dimensional circuit board 700 in the fifth preferred embodiment.

By these configurations, by the wiring-electrode group formed metal layer at high density, the mounting density of electronic components can be enhanced. A signal transmission of high speed is realized by lowering of wiring resistance by metal layer, and a three-dimensional circuit board high in function and multiple in functions may be easily realized.

Further, by connecting to the electronic components through the metal layer, a three-dimensional circuit board enhanced in connection strength with solder bumps, or lowered in connection resistance may be fabricated.

On the surface exposed from insulating layer 550 of first-step first wiring-electrode 932 corresponding to the lowest step of three-dimensional circuit board 980, a metal layer may be formed again by screen printing method or plating method.

The seventh preferred embodiment of the present invention may be applied in the three-dimensional circuit boards in the foregoing preferred embodiments.

Eighth Preferred Embodiment

A manufacturing method of three-dimensional circuit board in the eighth preferred embodiment of the present invention is described below.

Figure 17A:
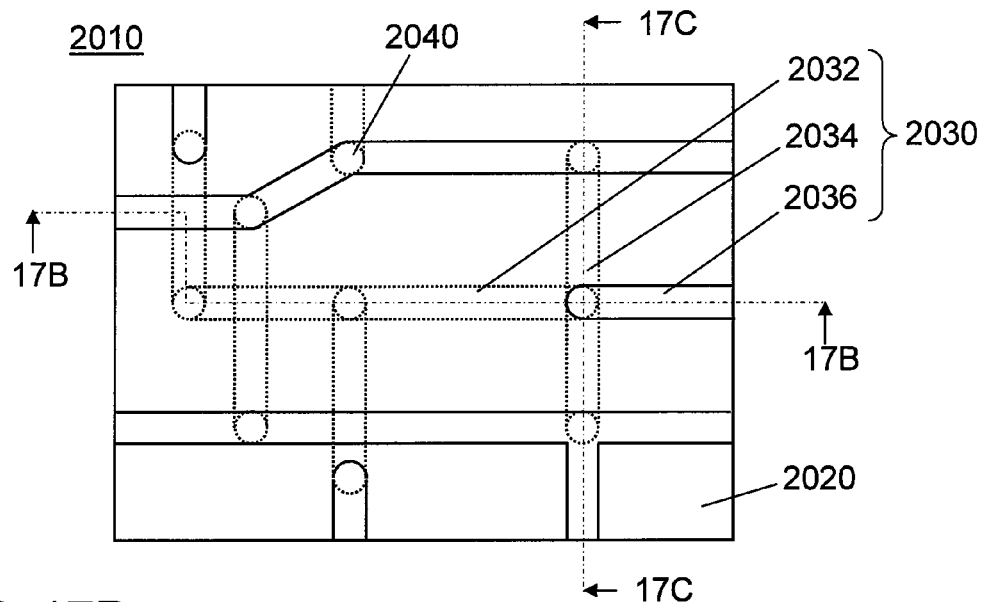
FIG. 17A is a partial plan view schematically showing a three-dimensional circuit board in an eighth preferred embodiment of the present invention.
Figure 17B:
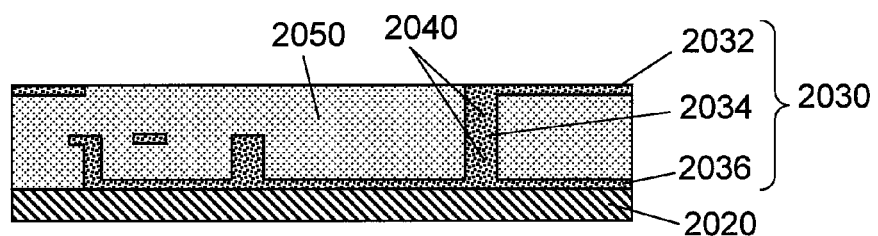
FIG. 17B is a sectional view along line 17B-17B in FIG. 17A.
Figure 17C:
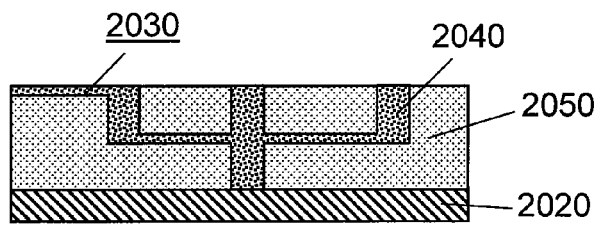
FIG. 17C is a sectional view along line 17C-17C in FIG. 17A.

FIG. 17A is a partial plan view schematically showing a three-dimensional circuit board manufactured by manufacturing method of three-dimensional circuit board in an eighth preferred embodiment of the present invention, FIG. 17B is a sectional view along line 17B-17B in FIG. 17A, and FIG. 17C is a sectional view along line 17C-17C in FIG. 17A.

As shown in FIG. 17A, in three-dimensional circuit board 2010, at least on one side of board 2020 of polyethylene terephthalate (PET) or the like, a wiring-electrode group formed three-dimensionally of photosetting resin containing conductive particles such as silver particles is buried in insulating layer 2050.

In the following explanation, for the ease of understanding, the band-shape wiring-electrode group in FIG. 17A is called first wiring-electrode group 2030, and the circular one is called second wiring-electrode 2040. Second wiring-electrode 2040 has the action same as the conductive vias in the conventional circuit board, and formed plural steps of first wiring-electrode group 2030 are connected in an altitude (thickness) direction. The shape of second wiring-electrode 2040 is not limited to circular shape, but may be designed freely, including polygonal or elliptical shape.

In three-dimensional circuit board 2010 formed by manufacturing method of three-dimensional circuit board in the eighth preferred embodiment of the present invention, first wiring-electrode group 2030 is composed of three steps, that is, first-step first wiring-electrode 2032 corresponding to the lowest step provided in an altitude direction of three-dimensional circuit board 10, second-step first wiring-electrode 2034, and third-step first wiring-electrode 2036 corresponding to the highest step.

A manufacturing method of three-dimensional circuit board in the eighth preferred embodiment of the present invention explained by referring to FIG. 18A to FIG. 18D and FIG. 19A to FIG. 19C.

FIG. 18A to FIG. 18D are sectional views explaining a manufacturing method of three-dimensional circuit board in the eighth preferred embodiment of the present invention. FIG. 19A to FIG. 19C are sectional views explaining a manufacturing method of three-dimensional circuit board in the eighth preferred embodiment of the present invention, specifically describing FIG. 18B.

Figure 18A:
FIG. 18A is a sectional view explaining a manufacturing method of three-dimensional circuit board in the eighth preferred embodiment of the present invention.
Figure 19A:
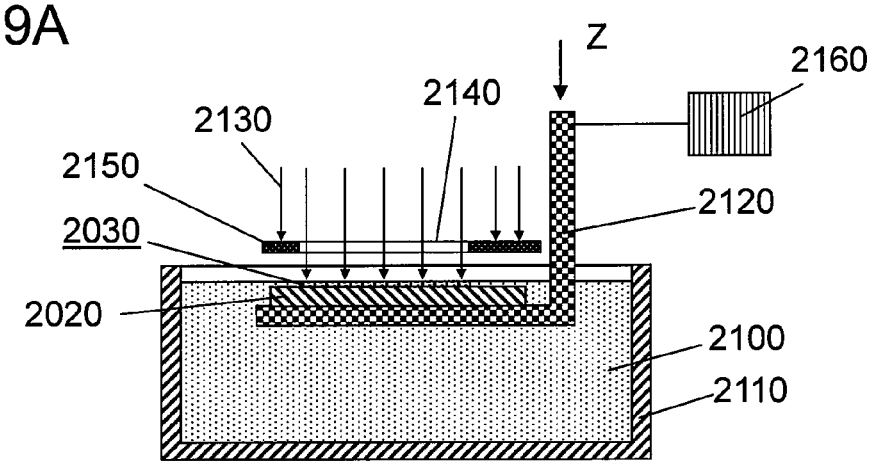
FIG. 19A is a sectional view explaining a manufacturing method of three-dimensional circuit board in the eighth preferred embodiment of the present invention.
Figure 19B:
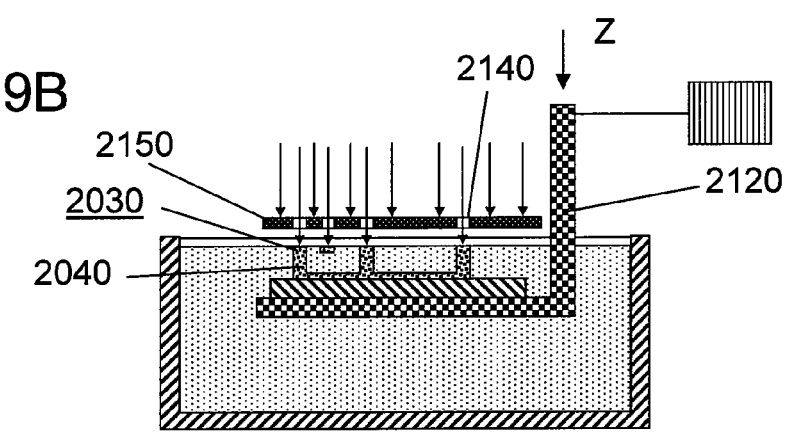
FIG. 19B is a sectional view explaining a manufacturing method of three-dimensional circuit board in the eighth preferred embodiment of the present invention.
Figure 19C:
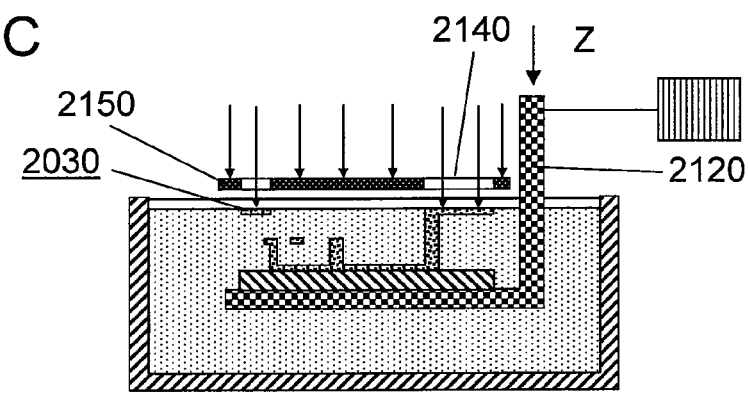
FIG. 19C is a sectional view explaining a manufacturing method of three-dimensional circuit board in the eighth preferred embodiment of the present invention.

In FIG. 18A, for example, a PET film, a polyimide film, glass epoxy board, a ceramic board or glass board in a thickness of 20 μm to 500 μm is prepared as board 2020.

Figure 18B:
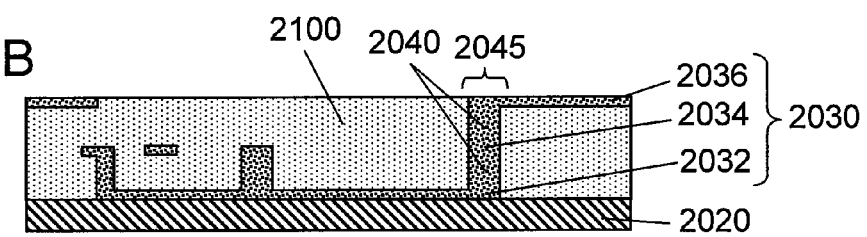
FIG. 18B is a sectional view explaining a manufacturing method of three-dimensional circuit board in the eighth preferred embodiment of the present invention.

Next, as shown in FIG. 18B, first-step first wiring-electrode 2032, second wiring-electrode 2040, second-step first wiring-electrode 2034, second wiring-electrode 2040, and third-step first wiring-electrode 2036 are sequentially formed on board 2020 by photo-forming method.

Referring now to FIG. 19A to FIG. 19C, the following explanation relates to a manufacturing method of three-dimensional wiring-electrode group composed of first wiring-electrode group 2030 and second wiring-electrode 2040.

First, as shown in FIG. 19A, in container 2110 filled with photosetting resin of acrylate (hereinafter referred to as "conductive photosetting resin") 2100 containing conductive filler such as silver particles, board 2020 mounted on table 2120 movable at least in Z-direction is immersed.

On conductive photosetting resin 2100 covering board 2020, mask 2150 having opening 2140 of a specified pattern formed of metal for shielding at least ultraviolet light or visible light is placed. Through opening 2140 of mask 2150, irradiation light 2130 emitted, for example, from light irradiation device (not shown), and is applied to conductive photosetting resin 2100 on board 2020. As a result, through mask 2150 having opening 2140 in pattern shape of, for example, first-step first wiring-electrode 2032, first-step first wiring-electrode 2032 is formed in batch in specified thickness on board 2020. The specified thickness is 1 μm to 100 μm in the case of wiring pattern, for example, and this thickness can be adjusted freely depending on the blending amount of the conductive filler, sensitivity of photosetting resin, intensity of irradiation light 2130, or illumination time. For example, using the color tone of the liquid crystal panel as mask 2150, it is preferred to blur the vicinity of opening 2140 by gray scale. As a result, a pattern of steep sectional shape may be formed.

Herein, the light irradiation device includes argon laser, He—Cd laser, YAG laser, helium-neon laser, semiconductor laser, high-pressure mercury lamp, xenon lamp, metal halide lamp, tungsten lamp, halogen lamp, or fluorescent lamp.

Next, as shown in FIG. 19B and FIG. 19C, table 2120 is sequentially moved in Z-direction, and mask 2150 having opening 2140 of specified pattern corresponding to first wiring-electrode group 2030 and second wiring-electrode 2040 is exchanged sequentially, and conductive photosetting resin 2100 is cured, and first wiring-electrode group 2030 and second wiring-electrode 2040 are formed.

As a result, a three-dimensional wiring-electrode group as shown in FIG. 18B is formed in conductive photosetting resin 2100.

Herein, table 2120 is moved corresponding to exchange of mask 2150 as explained below. At this time, depending on the thickness of each step of first wiring-electrode group 2030 and the altitude (thickness) of second wiring-electrode 2040, in consideration of intensity of irradiation light 2130, illumination time, or shape or size of conductive filler of conductive photosetting resin 2100, the moving amount of table 2120 is controlled by control device 2160.

A manufacturing method of the three-dimensional circuit board having the mask opening shape formed on the board and the mask opening shape is explained more specifically below while referring to FIG. 20A to FIG. 20E and FIG. 21A to FIG. 21E.

FIG. 20A to FIG. 20E are plan views showing an example of a mask at each processing step for forming a first wiring-electrode group and a second wiring-electrode on a three-dimensional board. FIG. 21A to FIG. 21E, at the left side, are plan views showing a wiring-electrode group formed on the board corresponding to each mask in FIG. 20A to FIG. 20E, and FIG. 21A to FIG. 21E, at the right side, are sectional views along line 21A-21A to line 21E-21E at the left side of FIG. 21A to FIG. 21E. The right side of FIG. 21A to FIG. 21E shows only the specified pattern after curing of the conductive photosetting resin, but in the actual process, an uncured conductive photosetting resin is present in the surrounding.

Figure 20A:
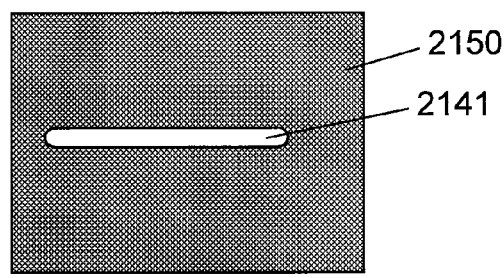
FIG. 20A is a plan view showing an example of a mask at each processing step for forming a first wiring-electrode group and a second wiring-electrode on a three-dimensional board in the manufacturing method of three-dimensional circuit board in the eighth preferred embodiment of the present invention.
Figure 21A:
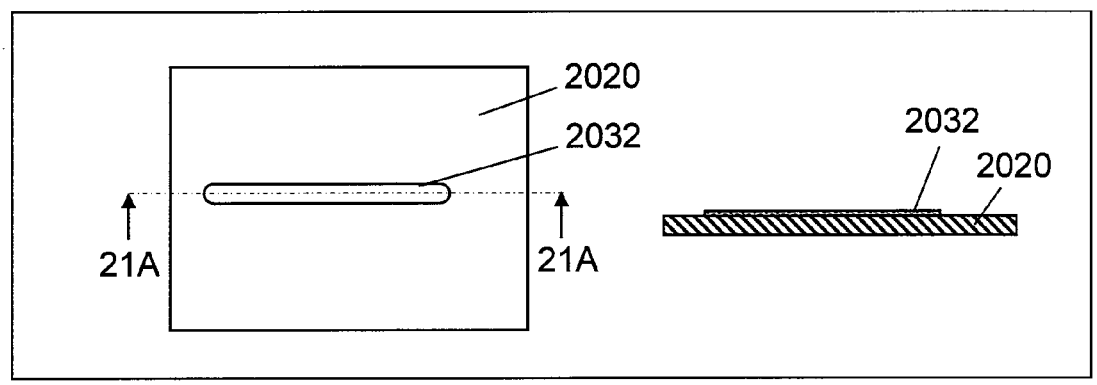
FIG. 21A is a diagram showing a wiring-electrode group formed on the board corresponding to the mask in FIG. 20A.

First, as shown in FIG. 20A, irradiation light is emitted to mask 2150 having opening 2141 in the shape of first-step first wiring-electrode, and the conductive photosetting resin is cured. As a result, first-step first wiring-electrode 2032 is formed on board 2020 as shown in FIG. 21A. At this time, board 2020 is held in sinking state in the conductive photosetting resin by the portion of thickness of first-step first wiring-electrode 2032, for example, about 20 μm, and photo-forming is carried out.

Figure 20B:
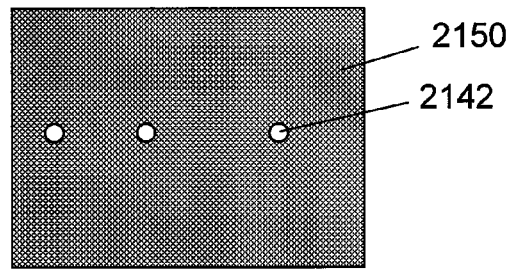
FIG. 20B is a plan view showing an example of a mask at each processing step for forming a first wiring-electrode group and a second wiring-electrode on a three-dimensional board in the manufacturing method of three-dimensional circuit board in the eighth preferred embodiment of the present invention.
Figure 21B:
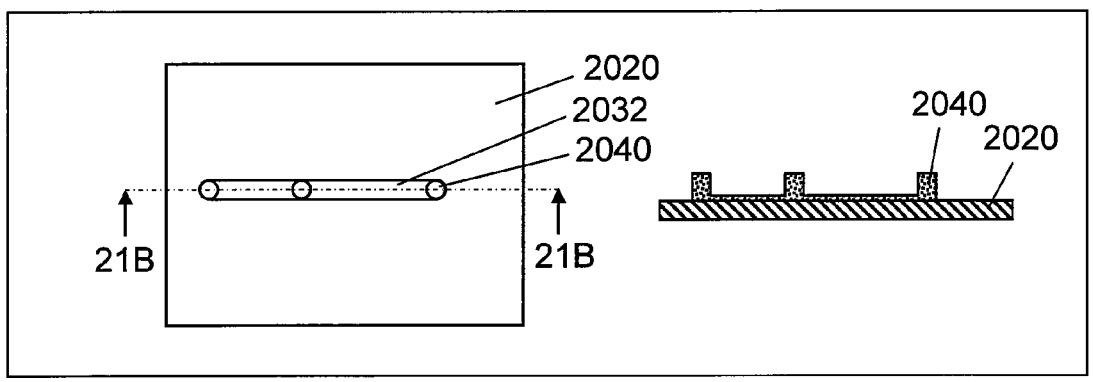
FIG. 21B is a diagram showing a wiring-electrode group formed on the board corresponding to the mask in FIG. 20B.

Next, as shown in FIG. 20B, irradiation light is emitted to mask 2150 having opening 2142 in the shape of second wiring-electrode for connecting between the first-step first wiring-electrode and second-step first wiring-electrode, and the conductive photosetting resin is cured. As a result, second wiring-electrode 2040 is formed on first-step first wiring-electrode 2032 as shown in FIG. 21B. At this time, board 2020 is held in sinking state in the conductive photosetting resin by the portion of thickness of second wiring-electrode 2040, for example, about 50 μm, and photo-forming is carried out.

Figure 20C:
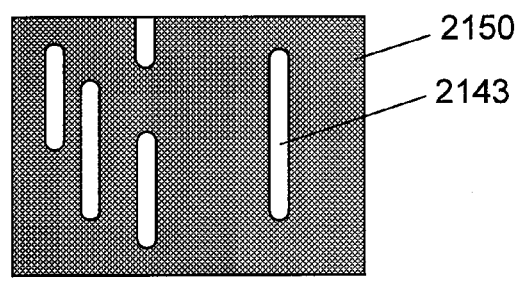
FIG. 20C is a plan view showing an example of a mask at each processing step for forming a first wiring-electrode group and a second wiring-electrode on a three-dimensional board in the manufacturing method of three-dimensional circuit board in the eighth preferred embodiment of the present invention.
Figure 21C:
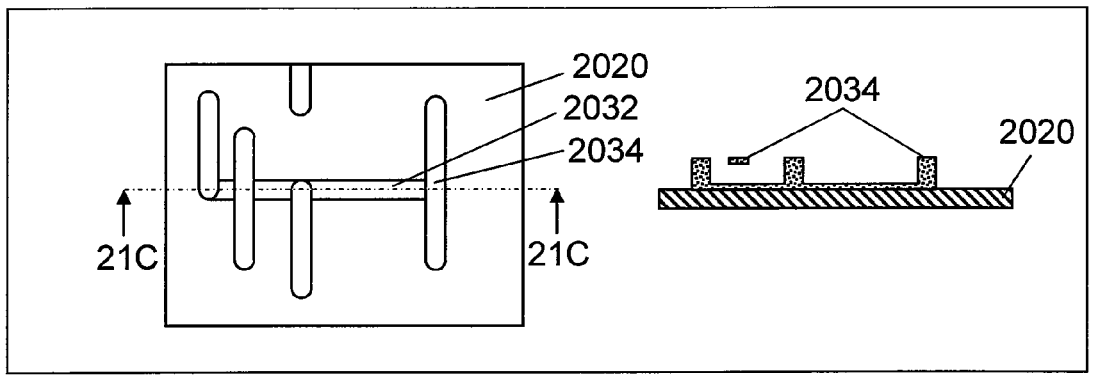
FIG. 21C is a diagram showing a wiring-electrode group formed on the board corresponding to the mask in FIG. 20C.

Next, as shown in FIG. 20C, irradiation light is emitted to mask 2150 having opening 2143 in the shape of second-step first wiring-electrode for connecting to the second wiring-electrode, and the conductive photosetting resin is cured. As a result, second-step first wiring-electrode 2034 is formed on second wiring-electrode 2040 as shown in FIG. 21C. At this time, board 2020 is held in sinking state in the conductive photosetting resin by the portion of thickness of second-step first wiring-electrode 2034, for example, about 20 μm, and photo-forming is carried out.

Figure 20D:
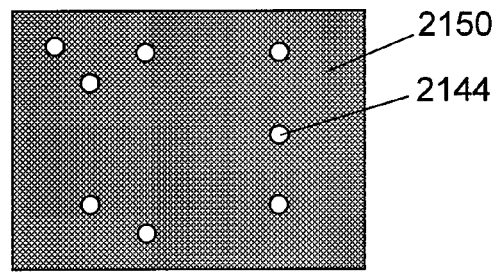
FIG. 20D is a plan view showing an example of a mask at each processing step for forming a first wiring-electrode group and a second wiring-electrode on a three-dimensional board in the manufacturing method of three-dimensional circuit board in the eighth preferred embodiment of the present invention.
Figure 21D:
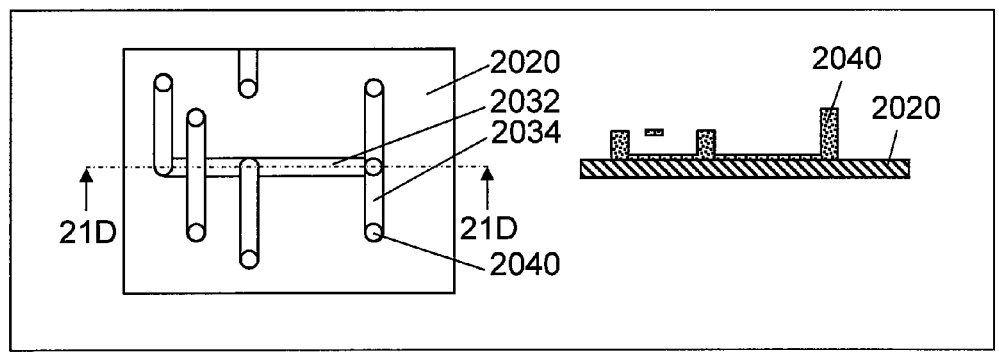
FIG. 21D is a diagram showing a wiring-electrode group formed on the board corresponding to the mask in FIG. 20D.

Next, as shown in FIG. 20D, irradiation light is emitted to mask 2150 having opening 2144 in the shape of second wiring-electrode for connecting between the second-step first wiring-electrode and third-step first wiring-electrode, and the conductive photosetting resin is cured. As a result, second wiring-electrode 2040 is formed on second-step first wiring-electrode 34 as shown in FIG. 21D. At this time, board 2020 is held in sinking state in the conductive photosetting resin by the portion of thickness of second wiring-electrode 2040, for example, about 75 μm, and photo-forming is carried out.

Figure 20E:
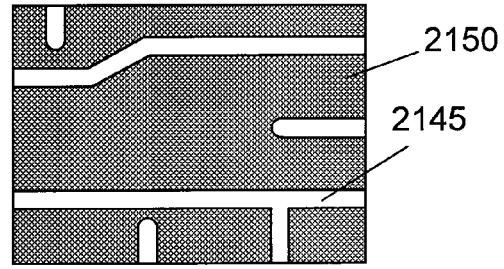
FIG. 20E is a plan view showing an example of a mask at each processing step for forming a first wiring-electrode group and a second wiring-electrode on a three-dimensional board in the manufacturing method of three-dimensional circuit board in the eighth preferred embodiment of the present invention.
Figure 21E:
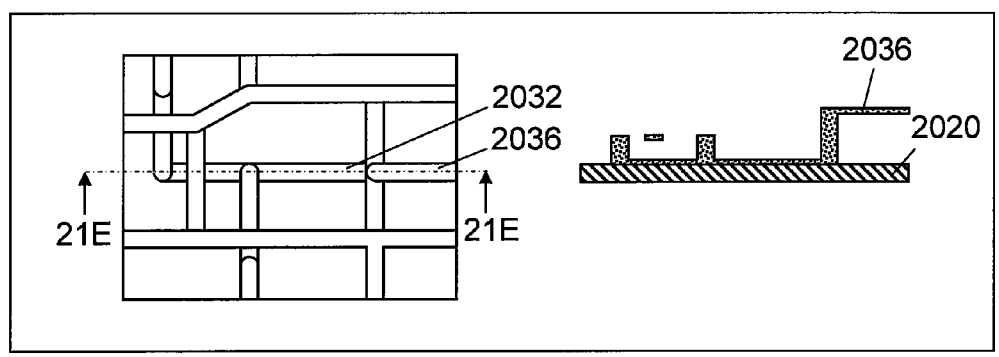
FIG. 21E is a diagram showing a wiring-electrode group formed on the board corresponding to the mask in FIG. 20E.

Finally, as shown in FIG. 20E, irradiation light is emitted to mask 2150 having opening 2145 in the shape of third-step first wiring-electrode for connecting to the second wiring-electrode, and the conductive photosetting resin is cured. As a result, third-step first wiring-electrode 2036 is formed on second wiring-electrode 2040 as shown in FIG. 21E. At this time, board 2020 is held in sinking state in the conductive photosetting resin by the portion of thickness of third-step first wiring-electrode 2036, for example, about 25 μm, and photo-forming is carried out.

As explained herein, according to the manufacturing method of the three-dimensional circuit board in the eighth preferred embodiment of the present invention, at least the connecting positions of the first wiring-electrode group and the second wiring-electrodes are integrated in a continuously identical shape, and formed in batch in the plane direction.

By such manufacturing method of the three-dimensional circuit board, the three-dimensional wiring-electrode group shown in FIG. 18B is formed in uncured conductive photosetting resin 2100.

Figure 18C:
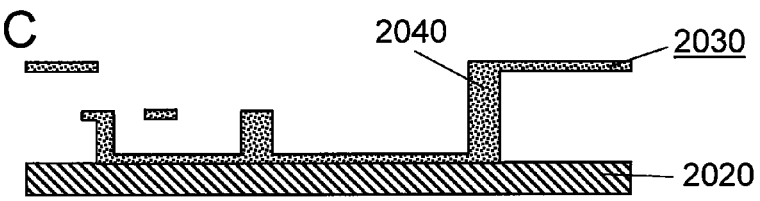
FIG. 18C is a sectional view explaining a manufacturing method of three-dimensional circuit board in the eighth preferred embodiment of the present invention.

Further, as shown in FIG. 18C, uncured conductive photosetting resin 2100 not illuminated by irradiation 2130 is removed, for example, by immersing in a solvent, by air blow, spin coater, or ultrasonic cleaning, and a three-dimensional wiring-electrode group comprising of first wiring-electrode group 2030 and second wiring-electrode 2040 is formed.

Figure 18D:
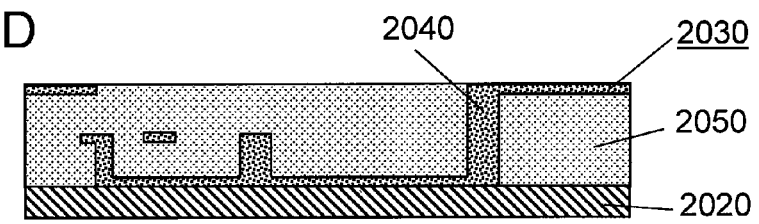
FIG. 18D is a sectional view explaining a manufacturing method of three-dimensional circuit board in the eighth preferred embodiment of the present invention.

Next, as shown in FIG. 18D, a wiring-electrode group comprising of first wiring-electrode group 2030 and second wiring-electrode 2040 shown in FIG. 18C is immersed in a container (not shown) filled with liquid resin such as acrylic, urethane, or epoxy resin. By curing with ultraviolet ray, three-dimensional circuit board 2010 having insulating layer 2050 is formed.

Meanwhile, insulating layer 2050 may be formed also by injecting PET resin around the wiring-electrode group by making use of capillary phenomenon.

As explained herein, according to the manufacturing method of the three-dimensional circuit board in the eighth preferred embodiment of the present invention, the three-dimensional wiring-electrode group composed of first wiring-electrode group and second wiring-electrode may be formed in batch, and the productivity is enhanced substantially, and a three-dimensional circuit board or the like may be fabricated easily.

Further, by exchanging the masks, by placing at arbitrary positions, the first wiring-electrode group and second wiring-electrode may be formed. As a result, the forming position of first wiring-electrode group and second wiring-electrode is not limited, so that a manufacturing method of high degree of freedom of design is realized.

Since the first wiring-electrode group and second wiring-electrode can be formed continuously only by exchanging the masks, interface is not formed between the first wiring-electrode group and second wiring-electrode. Hence, it is free from increasing of connection resistance at the interface, and a three-dimensional circuit board of small fluctuation and excellent connection reliability can be fabricated.

Same as in the first preferred embodiment, as explained by referring to FIG. 2A and FIG. 2B, the wiring-electrode group composed of the first wiring-electrode group and second wiring-electrode formed by the manufacturing method of the three-dimensional circuit board in the eighth preferred embodiment of the present invention has the following features.

FIG. 2A is a partial perspective view showing a connected state of first wiring-electrode group and second wiring-electrode, and FIG. 2B is a partial plan view explaining the positional relation of first wiring-electrode group and second wiring-electrode.

That is, as shown in FIG. 2A, first-step first wiring-electrode 32 and second-step first wiring-electrode 34 are formed continuously and integrally in a same shape at least in their connecting portions 45 by way of second wiring-electrode 40.

As a result, as shown in FIG. 2B, the conventionally required lands are not needed. As a result, the first wiring-electrode group and second wiring-electrode can be formed continuously, and lands in consideration of deviation of position are not required, so that the first wiring-electrode group and second wiring-electrode can be formed at narrow pitches.

In the eighth preferred embodiment of the present invention, a specified three-dimensional wiring-electrode group is manufactured by exchanging the masks, but the method is not limited to this example alone. For example, a liquid crystal panel of matrix drive type which can form a specified pattern by using CAD data may be used as a mask. At this time, to prevent decline of characteristics of liquid crystal material of liquid crystal panel, the irradiation light for illuminating the liquid crystal panel is preferred to be visible light such as argon laser (wavelength 488 nm) or helium-neon laser (wavelength 632.8 nm). In particular, a shorter wavelength is preferred when forming a fine pattern.

As a result, the mask exchange process can be omitted, and a three-dimensional circuit board can be manufactured in a shorter time.

Figure 22:
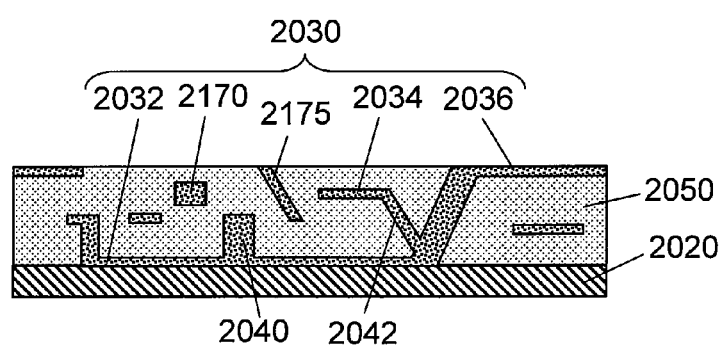
FIG. 22 is a sectional view explaining another example of the shape of first wiring-electrode group and second wiring-electrode formed by the manufacturing method on the three-dimensional board in the eighth preferred embodiment of the present invention.

Further, by making use of color tone of the liquid crystal panel, by blurring the vicinity of opening 2140 by gray scale, effects of light scattering of conductive particles or diffraction light occurring near the mask can be eliminated. Moreover, in the liquid crystal panel, since arbitrary patterns can be formed continuously by electric signals, first wiring-electrodes 2170, 2175 and second wiring-electrode 2042 arbitrary in inclination or different in sectional shape as shown in FIG. 22 can be formed freely. As a result, a three-dimensional circuit board of higher degree of freedom design and further excellent in versatility can be realized.

A photo-forming device for realizing the manufacturing method of three-dimensional circuit board in the eighth preferred embodiment of the present invention is described below while referring to FIG. 23.

Figure 23:
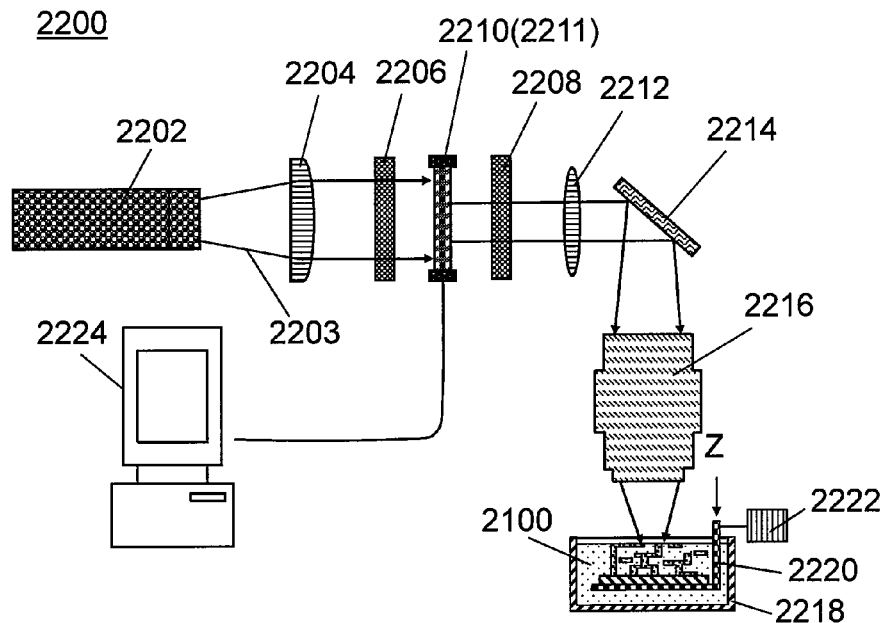
FIG. 23 is an outline drawing of a photo-forming device for realizing the manufacturing method on the three-dimensional board in the eighth preferred embodiment of the present invention.

FIG. 23 is an outline drawing of photo-forming device 2200 for realizing the manufacturing method on the three-dimensional circuit board in the eighth preferred embodiment of the present invention.

As shown in FIG. 23, photo-forming device 2200 is composed of, for example, light irradiation device 2202, collimator unit 2204, polarizer 2206, 2208, pattern forming device 2210, lens 2212, mirror 2214, objective lens 2216, container 2218 filled with conductive photosetting resin, table 2220 for moving the object, and control device 2222 for controlling them.

Light irradiation device 2202 is realized by laser or lamp for generating visible light or ultraviolet light.

Pattern forming device 2210 is composed of an exchangeable metal mask or a liquid crystal panel. In the case of the liquid crystal panel, specified two-dimensional pattern information such as CAD data is displayed in liquid crystal panel 2211 by way of PC or control device 2224.

In the following explanation, liquid crystal panel 2211 is used as pattern forming device 2210, and its operation is described.

For example, laser light 2203 emitted from light irradiation device 2202 enters collimator unit 2204, and the beam diameter of laser light 2203 is expanded so as to illuminate the entire surface of liquid crystal panel 2211.

By polarizer 2206 disposed before liquid crystal panel 2211, for example, the light of straight polarized portion of laser light 2203 is cut, and the contrast of the pattern is enhanced.

Further, liquid crystal panel 2211 displays a specified pattern output from control unit 2224 by matrix drive of, for example, thin film transistor (TFT).

By polarizer 2208 provided after liquid crystal panel 2211, the pattern displayed in liquid crystal panel 2211 is converted into contrast of light.

Laser light 2203 passing through polarizer 2208 is passed through an optical system composed of lens 2212, mirror 2214, and objective lens 2216, for converting a pattern into an arbitrary size, and is focused on conductive photosetting resin 2100, and exposed in a specified pattern.

By control device 2222, table 2220 is moved sequentially in, for example, Z-direction, and a three-dimensional circuit is formed.

Pattern forming device 2210, if composed of a plurality of masks, has a mechanism for exchanging masks corresponding to the operation of table 2220.

Figure 24:
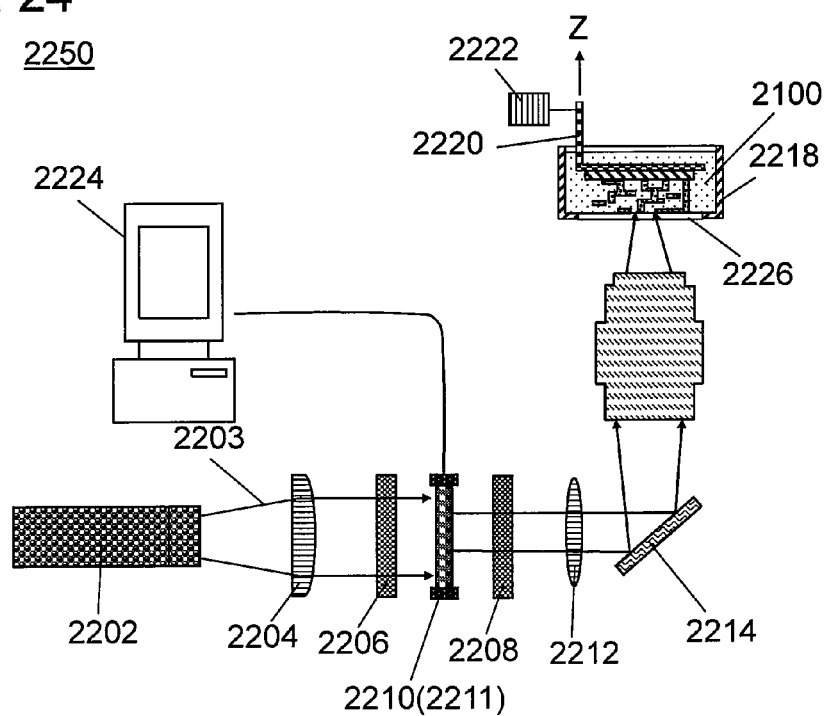
FIG. 24 is an outline drawing of a photo-forming device showing another example of the manufacturing method on the three-dimensional board in the eighth preferred embodiment of the present invention.

In this example, laser light 2203 is emitted from above container 2218, but it is not limited. For example, as in photo-forming device 2250 shown in FIG. 24, light transmission window 2226 that laser light 2203 may pass the bottom of container 2218 is formed of quartz or the like, and a three-dimensional circuit board may be formed while lifting board 2020 placed on table 2220. In this case, conductive photosetting resin 2100 is supply flatly because it is defined by the bottom of container 2218 and board 2020. Accordingly, the forming time is shortened as compared with the case of forming a three-dimensional circuit board by once flattening by making use of viscosity of conductive photosetting resin 2100, and then pulling down table 2220.

In the above example, the wiring-electrode group is buried by the insulating layer, but it is not limited. For example, if the wiring-electrode group has enough mechanical strength for maintaining the structure of three-dimensional circuit board, the insulating layer is not particularly necessary. As a result, since a dielectric layer such as the insulating layer is not provided, a three-dimensional circuit board of further enhanced high frequency characteristics may be obtained.

When an insulating layer is formed, the board may be removed by polishing or other method. As a result, a three-dimensional circuit board of thinner type is realized.

Another example of application of the manufacturing method of the three-dimensional circuit board in the eighth preferred embodiment of the present invention is described while referring to FIG. 25A to FIG. 25D.

FIG. 25A to FIG. 25D are diagrams explaining another example applying the manufacturing method on the three-dimensional circuit board in the eighth preferred embodiment of the present invention.

This is an application of so-called wafer level chip size package (WL-CSP), in which a three-dimensional circuit is formed and wired again on electrode terminal 2320 of semiconductor chip 2310 formed on wafer 2300.

Figure 25A:
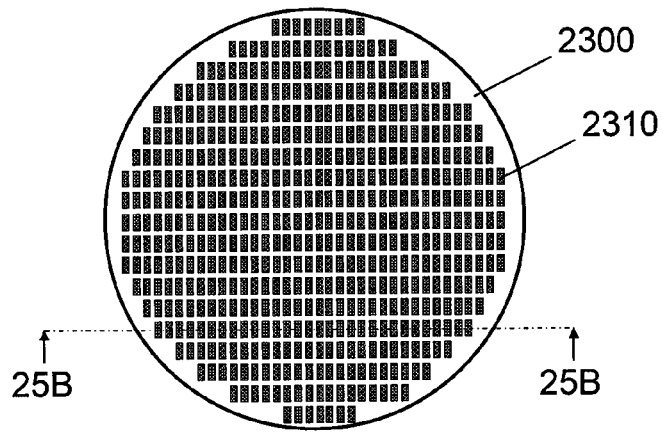
FIG. 25A is a diagram explaining another example applying the manufacturing method on the three-dimensional board in the eighth preferred embodiment of the present invention.
Figure 25B:
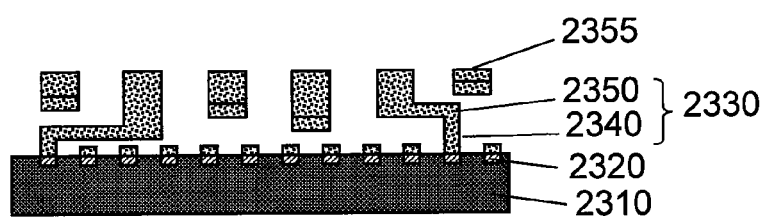
FIG. 25B is a diagram explaining another example applying the manufacturing method on the three-dimensional board in the eighth preferred embodiment of the present invention.
Figure 25C:
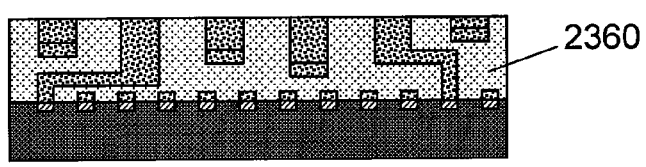
FIG. 25C is a diagram explaining another example applying the manufacturing method on the three-dimensional board in the eighth preferred embodiment of the present invention.
Figure 25D:
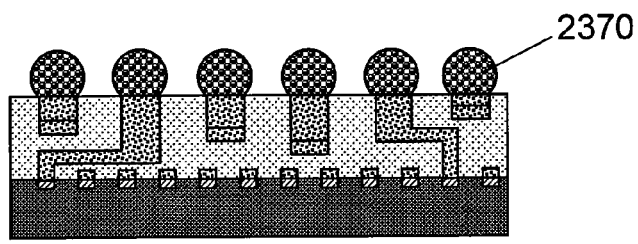
FIG. 25D is a diagram explaining another example applying the manufacturing method on the three-dimensional board in the eighth preferred embodiment of the present invention.

FIG. 25A is a plan view showing semiconductor chip 2310 formed on wafer 2300 of silicon or the like, and FIG. 25B to FIG. 25D are sectional views along line 25B-25B in FIG. 25A explaining the process of forming a three-dimensional circuit on wafer 2300 in FIG. 25A. FIG. 25B to FIG. 25D show individual semiconductor chips 2310, but they are usually formed in a state of wafer 2300.

First, as shown in FIG. 25A, wafer 2300 forming semiconductor chips 2310 is prepared.

Next, as shown in FIG. 25B, by the photo-forming method explained above, on electrode terminals 2320 formed at pitches of, for example, 40 μm of semiconductor chips 2310, wiring-electrode group 2330 formed of second wiring-electrode 2340 and first wiring-electrode 2350 is formed. Accordingly, fine electrode terminals 2320 formed in semiconductor chips 2310 are expanded to the whole surface of semiconductor chips 2310, for example, by a three-dimensional circuit, and can be wired again into a layout of electrode terminals 2355 formed at pitches of 300 μm, for example, so as to be mounted by flip-chip on other circuit board.

Next, as shown in FIG. 25C, around wiring-electrode group 2330 wired three-dimensionally, insulating layer 2360 is formed, for example, by sealing resin, and wiring-electrode group 2330 is buried. At this time, when burying, at least wiring-electrode group 2330 of the highest step should be exposed, but if it is difficult, wiring-electrode group 2330 may be exposed by polishing process such as CMP (chemical-mechanism polishing). As a result, wiring electrode group 2330 may be securely exposed, and connection of high reliability is realized.

Next, as shown in FIG. 25D, bumps 2370 are formed on electrode terminals 2355 of exposed wiring-electrode group 2330 by, for example, solder ball.

Semiconductor chips 2310 forming bumps 2370 are separated into individual pieces by dicing or other method, and WL-CSP of high reliability may be obtained easily.

In this example, bumps 2370 are formed in other process by solder ball, but the present invention is not limited to this example. For example, by the photo-forming method, bumps may be formed in batch integrally with the three-dimensional wiring-electrode group. In this case, it is important to form so that the bumps may not be buried at least by insulating layer 2360.

In this example, the wiring-electrode group for re-wiring is formed directly on semiconductor chips 2310, but the present invention is not limited to this example. For example, it may be manufactured, for example, as an interposer having a wiring-electrode group for re-wiring.

Conductive photosetting resin 2100 used in the eighth preferred embodiment of the present invention is specifically described below. These materials may be also used in another preferred embodiments.

Specifically, conductive photosetting resin 2100 contains at least photosetting resin having photosetting monomer and photopolymerization initiator, and conductive filler.

The photosetting monomer is preferred to contain both a multifunctional monomer having a plurality of photopolymerizable groups, and a monofunctional monomer having only one photopolymerizable group.

The multifunctional monomer having a plurality of photopolymerizable groups is, for example, a compound having two or more polymerizable functional groups such as carbon-carbon double bond cobonding in one molecule. The number of polymerizable functional groups to be contained in the multifunctional monomer is 3 to 10, but the range is not particularly specified. If the number of polymerizable functional groups is smaller than 3, the hardening property may be lowered. If the number of functional groups is more than 10, the molecular size is too large, and the viscosity tends to be larger.

Specific examples of multifunctional monomer having a plurality of photopolymerizable groups include allylated cyclohexyl diacrylate, 1,4-butane diol diacrylate, 1,3-butylene glycol diacrylate, 1,6-hexane diol diacrylate, ethylene glycol diacrylate, diethylene glycol diacrylate, triethylene glycol diacrylate, polyethylene glycol diacrylate, pentaerythritol triacrylate, pentaerythritol tetra-acrylate, dipentaerythritol penta-acrylate, dipentaerythritol hexa-acrylate, dipentaerythritol monohydroxy penta-acrylate, ditrimethylol propane tetra-acrylate, glycerol diacrylate, methoxy cyclohexyl diacrylate, neopentyl glycol diacrylate, propylene glycol diacrylate, polypropylene glycol diacrylate, triglycerol diacrylate, trimethylol propane triacrylate, bisphenol A diacrylate, diacrylate of bisphenol A ethylene oxide adduct, and diacrylate of bisphenol A propylene oxide. Or part or all of acrylic groups contained in the above compounds may be displaced by, for example, methyacrylic groups.

A monofunctional monomer containing only one photopolymerizable group is added to the conductive photosetting resin for preventing fogging. If the monofunctional monomer is not contained, not only the photosetting may be likely to promote, but also the photosetting advances not only to the exposed portions but also to non-exposed portions, and the pattern boundary may be unclear, and fogging phenomenon is likely to occur.

Since the monofunctional monomer is relatively low in viscosity, and may be added for lowering the viscosity of the conductive photosetting resin.

Examples of the monofunctional monomer containing only one photopolymerizable group include benzyl acrylate, butoxy ethyl acrylate, butoxy triethylene glycol acrylate, cyclohexyl acrylate, dicyclopentanyl acrylate, dicyclopentenyl acrylate, 2-ethyl hexyl acrylate, glycerol acrylate, glycidyl acrylate, heptadecafluorodecyl acrylate, 2-hydroxy ethyl acrylate, isobonyl acrylate, 2-hydroxypropyl acrylate, iso-dexyl acrylate, iso-octyl acrylate, lauryl acrylate, 2-methoxy ethyl acrylate, methoxy ethylene glycol acrylate, methoxy diethylene glycol acrylate, octafluoropentyl acrylate, phenoxy ethyl acrylate, stearyl acrylate, and trifluoroethyl acrylate. The compounds of which acrylic groups displaced by methacrylic groups may be also used as monofunctional monomers.

As the photopolymerization initiator, commercial photopolymerization initiators may used appropriately. As the photopolymerization initiator, combinations of photo-reducing pigment and reducing agent may be employed. But the photopolymerization initiator is not particularly limited.

Photo-reducing pigments include benzophenone, o-benzoyl methyl benzoate, 4,4'-bis(dimethylamine) benzophenone, 4,4'-bis(diethylamine) benzophenone, α-amino acetophenone, 4,4'-dichloro benzophenone, 4-benzoyl-4'-methyl diphenyl ketone, dibenzyl ketone, fluorenone, 2,2-diethoxy acetophenone, 2.2-dimethoxy-2-phenyl acetophenone, p-tert-butyl chloro acetophenone, thioxanthone, 2-methyl thioxanthone, 2-chloro thioxanthone, 2-isopropyl thioxanthone, diethyl thioxanthone, benzyl methyl ketal, benzyl methoxy ethyl acetal, benzoin methyl ether, anthraquinone, 2-tert-butyl anthraquinone, 2-amyl anthraquinone, β-chloranthraquinone, anthrone, benzanthrone, dibenzanthrone, methylene anthrone, 4-azidobenzyl acetophenone, 2,6-bis (p-azidobenzylidene)-4-methyl cyclohexanone, 1-phenyl-propane dione-2-(O-ethoxycarbonyl) oxime, 1,3-diphenyl-propane trione-2-(O-ethoxycarbonyl) oxime, 1-phenyl-3-ethoxy-propane trione-2-(O-benzoyl) oxime, Michler's ketone, 2-methyl-1-[4-(methylthio) phenyl]-2-morpholino propane-1-one, 2-benzyl-2-dimethylamino-1-(4-morpholino phenyl)-butanone-1, naphthalene sulfonyl chloride, quinoline sulfonyl chloride, n-phenyl thio acridone, 2,2'-azobis isobutylonitrile, diphenyl sulfide, benzthiazole disulfide, triphenyl phosphine, camphaquinone, carbon tetrabromide, tribromophenyl sulfone, benzoyl peroxide, eosin, and methylene blue. These may be used either alone or in combination of two or more compounds.

As the reducing agent, for example, ascorbic acid or triethanolamine may be used. One agent may be used or two or more may be combined.

The conductive filler is not particularly specified as far as conductive fine metal particles are used. Examples include fine particles of gold, silver, platinum, nickel, copper, palladium, molybdenum, and tungsten. These fine metal particles may be used either alone or in combination of two or more types. Or alloy powder of an alloy containing these elements may be used as conductive filler.

To obtain a wiring-electrode group of low resistance by low-temperature firing, it is preferred to use conductive filler made of a metal material of relatively low melting point and low specific resistance. As such metal materials, gold, silver and copper are preferred. But gold is very expensive, and copper is likely to be oxidized and is not fired in air, and hence silver is most appropriate.

The shape of the conductive filler is not particularly specified, and may be lumpy, scaly, fine crystalline, spherical, granular, flaky or amorphous. In particular, spherical or granular conductive filler may be preferred. It is because the light transmission in exposure and exposure efficiency are excellent.

The average particle size of the conductive filler is less than 10 μm, preferably less than 3 μm, or more preferably less than 1 μm. When the average particle size of the conductive filler is less than 3 μm, firing is possible at low temperature of 150° C. to 350° C., and the specific resistance after firing is low, and a wiring-electrode group of excellent electric conductivity is obtained. By using such fine particles, a conductive photosetting resin of high resolution is obtained. Further, when the average particle size of the conductive filler is less than 1 μm, firing at much lower temperature is possible, and a finer wiring-electrode group can be formed. If the average particle size of the conductive filler is more than 10 μm, the surface roughness of the conductive photosetting resin is increased, and the dimensional precision is lowered.

In order to supply the conductive photosetting resin in a short time when moving the board, the viscosity of the conductive photosetting resin is preferred to be 30 Pa·s or less, or 1 Pa·s or less more preferably. In particular, when the viscosity of the conductive photosetting resin is 1 Pa·s or less, the supply time of the conductive photosetting resin onto the board is further shortened, and the thickness of the conductive photosetting resin can be reduced, and the resolution of the wiring-electrode group can be enhanced. By shortening the supply time, the productivity can be enhanced. On the other hand, if the viscosity of the conductive photosetting resin is more than 30 Pa·s, it may take too much time in forming the wiring-electrode group of specified thickness, or air may mix into the conductive photosetting resin in the supply process.

Herein, the viscosity was measured by using a corn plate type viscometer at temperature of 25° C.

In the photosetting resin contained in the conductive photosetting resin, proper blending amounts of multifunctional monomer, monofunctional monomer, and photopolymerization initiator are preferably, in 100 parts by weight of conductive filler, 5 parts by weight to 30 parts by weight of multifunctional monomer, 0.05 part by weight to 10 parts by weight of monofunctional monomer, and 0.1 part by weight to 5 parts by weight of photopolymerization initiator. If the blending amounts of the photosetting resin materials are out of the specified ranges, desired conductivity may not be obtained, and problems may be found in adhesion or forming of wiring-electrode group.

The conductive photosetting resin may contain, aside from the specified conductive fillers and photosetting resins, dispersion agents, viscosity regulating agents, and others as required.

Specifically, when a conductive photosetting resin containing 90 wt. % of spherical silver particles of 3 μm as conductive filler was sintered at 200° C., the specific resistance of the wiring-electrode was about $5 \times 10^{-5}$ Ω·cm to $1 \times 10^{-3}$ Ω·cm.

Ninth Preferred Embodiment

A three-dimensional circuit board in a ninth preferred embodiment of the present invention is described below.

Figure 26A:
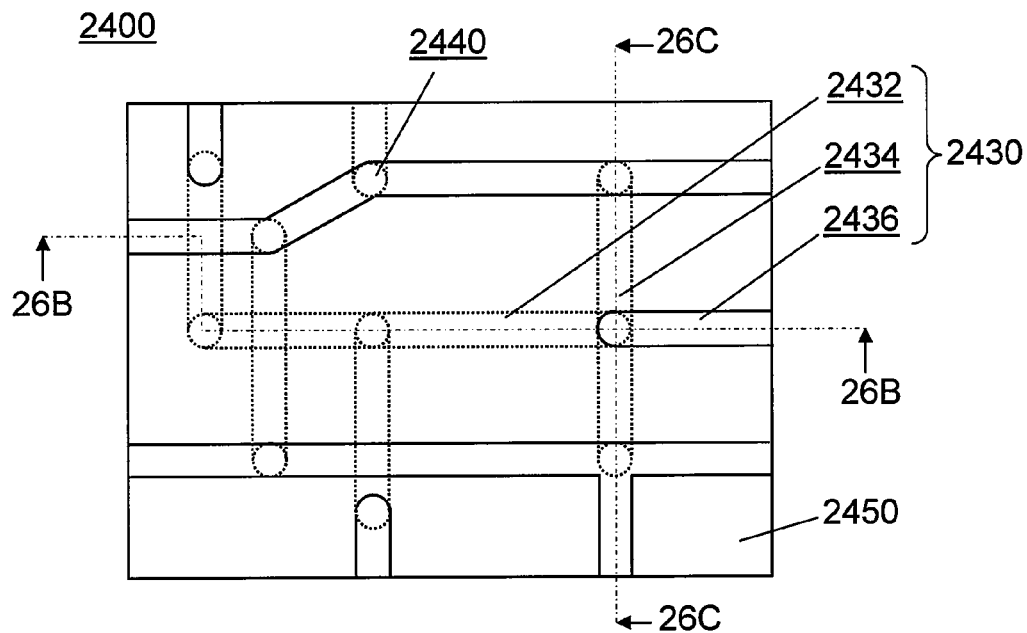
FIG. 26A is a partial plan view schematically showing a three-dimensional circuit board in a ninth preferred embodiment of the present invention.
Figure 26B:
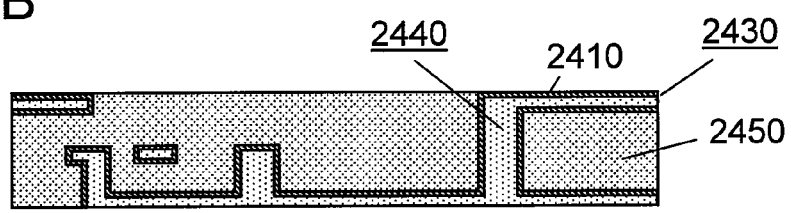
FIG. 26B is a sectional view along line 26B-26B in FIG. 26A.
Figure 26C:
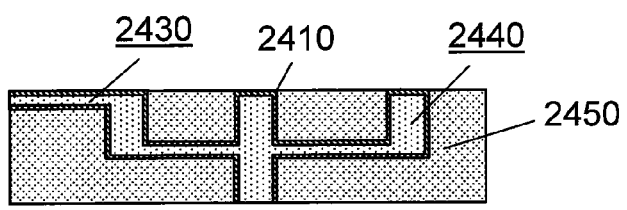
FIG. 26C is a sectional view along line 26C-26C in FIG. 26A.

FIG. 26A is a partial plan view schematically showing a three-dimensional circuit board in a ninth preferred embodiment of the present invention, FIG. 26B is a sectional view along line 26B-26B in FIG. 26A, and FIG. 26C is a sectional view along line 26C-26C in FIG. 26A.

As shown in FIG. 26A to FIG. 26C, three-dimensional circuit board 2400 is composed of a wiring-electrode group having metal layer 2410 formed on the outer surface of wiring resin group formed three-dimensionally by a photosetting resin such as urethane acrylate resin, which is buried by insulating layer 2450. Herein, metal layer 2410 is formed of gold, silver or copper, by electroless plating or other method.

That is, the ninth preferred embodiment is similar to the eighth preferred embodiment, except that the wiring-electrode group is formed by forming metal layer 2410 on the outer surface of the wiring resin group.

In the following explanation, for the ease of understanding, the band-shape wiring-electrode group in FIG. 26A is called first wiring-electrode group 2430, and the circular one is called second wiring-electrode 2440. Second wiring-electrode 2440 has the action same as the conductive vias in the conventional circuit board, and plural steps of first wiring-electrode group 2430 are connected in an altitude (thickness) direction.

In the ninth preferred embodiment of the present invention, first wiring-electrode group 2430 is composed of three steps, that is, first-step first wiring-electrode 2432 corresponding to the lowest step provided in an altitude direction of three-dimensional circuit board 2400, second-step first wiring-electrode 2434, and third-step first wiring-electrode 2436 corresponding to the highest step.

A manufacturing method of the three-dimensional circuit board in the ninth preferred embodiment of the present invention is described below while referring to FIG. 27A to FIG. 27F. Same component elements as in FIG. 26A are identified with same reference numerals.

FIG. 27A to FIG. 27F are sectional views explaining a manufacturing method of three-dimensional circuit board in the ninth preferred embodiment of the present invention.

Figure 27A:
FIG. 27A is a sectional view explaining a manufacturing method of three-dimensional circuit board in the ninth preferred embodiment of the present invention.

In FIG. 27A, for example, a PET film, a polyimide film, a glass epoxy board, a ceramic board, or a glass board in a thickness of 20 μm to 500 μm is prepared as board 2420.

Figure 27B:
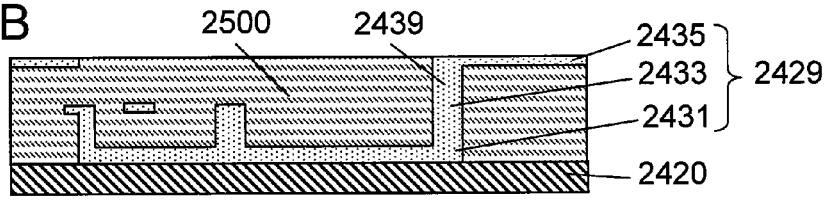
FIG. 27B is a sectional view explaining a manufacturing method of three-dimensional circuit board in the ninth preferred embodiment of the present invention.

First, as shown in FIG. 27B, on board 2420, the following layers are sequentially formed by photo-forming method, that is, first wiring resin group 2429 comprising of first-step first wiring resin 2431, second-step first wiring resin 2433, third-step first wiring resin 2435, and second wiring resin 2439 connecting these steps in the altitude direction. At this time, at least connecting portions 2445 of first wiring resin group 2429 and second wiring resin 2439 are integrated in a continuously identical shape.

The manufacturing method of the first wiring resin group and second wiring resin is same as that of the eighth preferred embodiment, except that the photosetting resin not containing conductive filler is used.

Figure 28A:
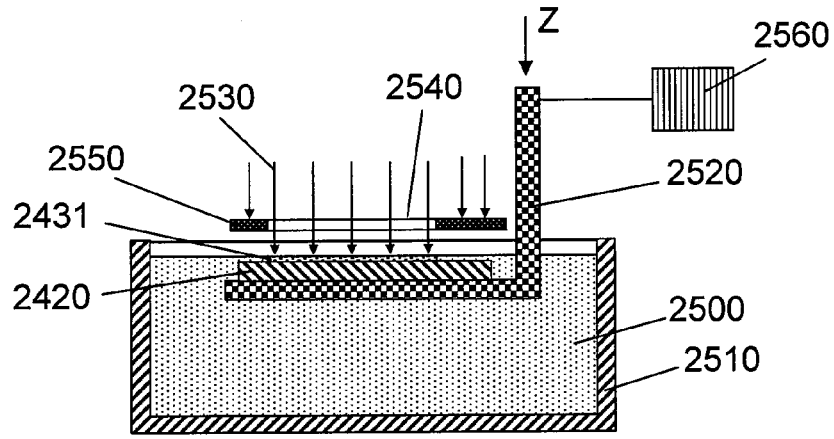
FIG. 28A is a sectional view explaining a manufacturing method of three-dimensional circuit board in the ninth preferred embodiment of the present invention.
Figure 28B:
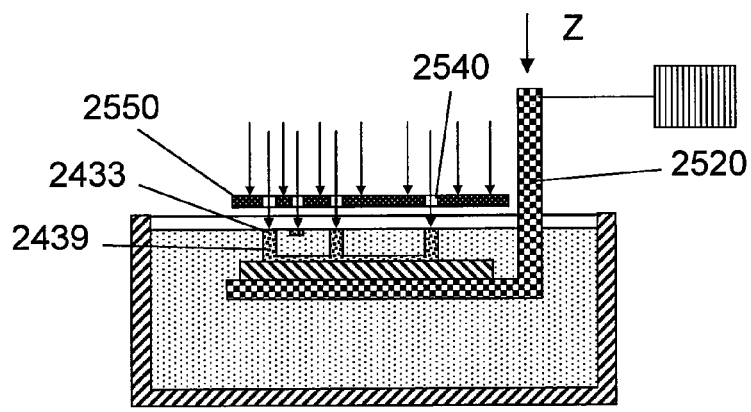
FIG. 28B is a sectional view explaining a manufacturing method of three-dimensional circuit board in the ninth preferred embodiment of the present invention.
Figure 28C:
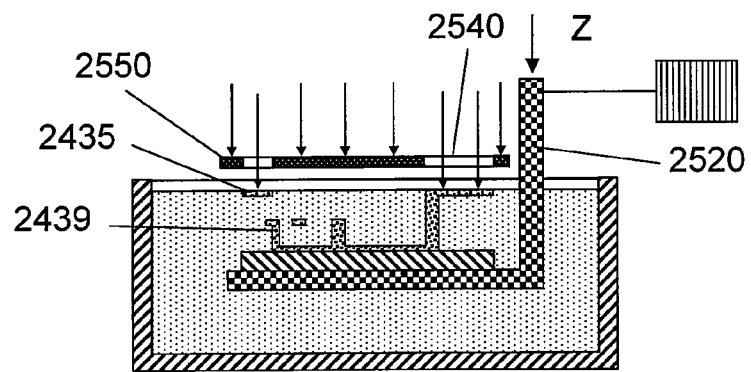
FIG. 28C is a sectional view explaining a manufacturing method of three-dimensional circuit board in the ninth preferred embodiment of the present
Figure 29A:
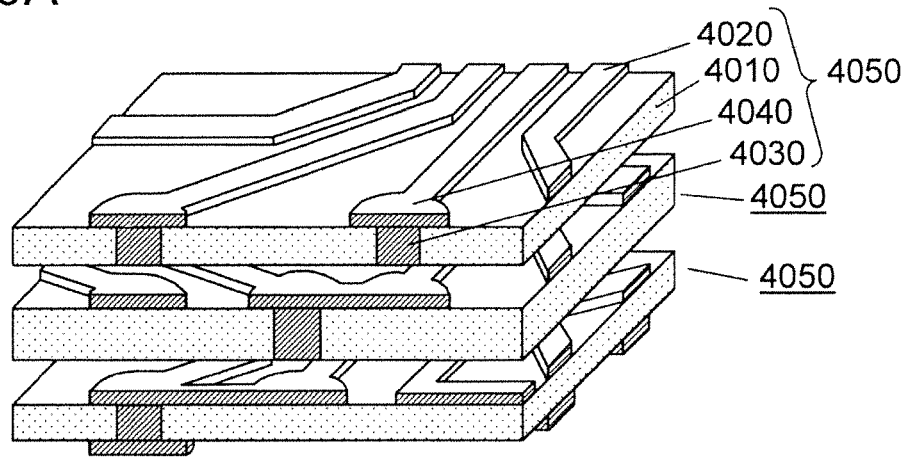
FIG. 29A is a partial perspective view explaining an essential structure and its manufacturing method of a multilayered printed circuit board laminated in four layers in a conventional art.
Figure 29B:
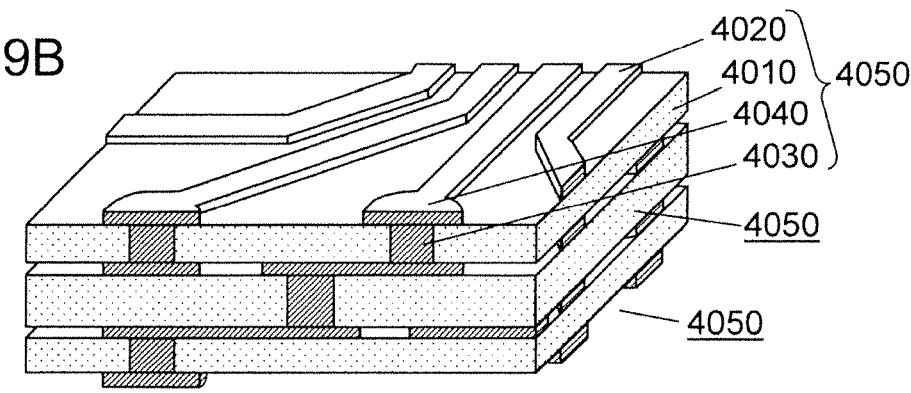
FIG. 29B is a partial perspective view explaining an essential structure and its manufacturing method of a multilayered printed circuit board laminated in four layers in the conventional art.
Figure 29C:
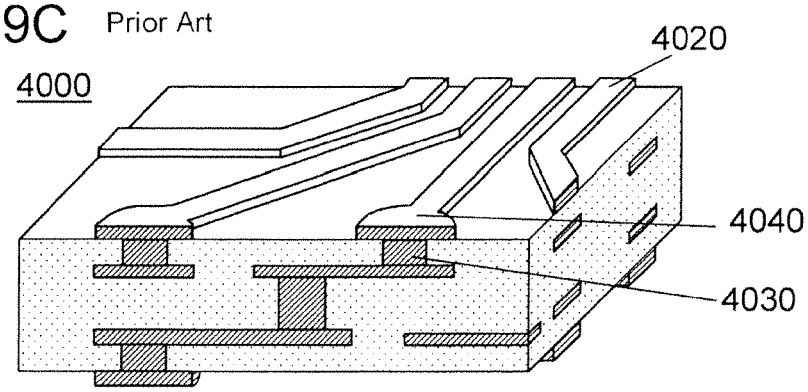
FIG. 29C is a partial perspective view explaining an essential structure and its manufacturing method of a multilayered printed circuit board laminated in four layers in the conventional art.
Figure 30:
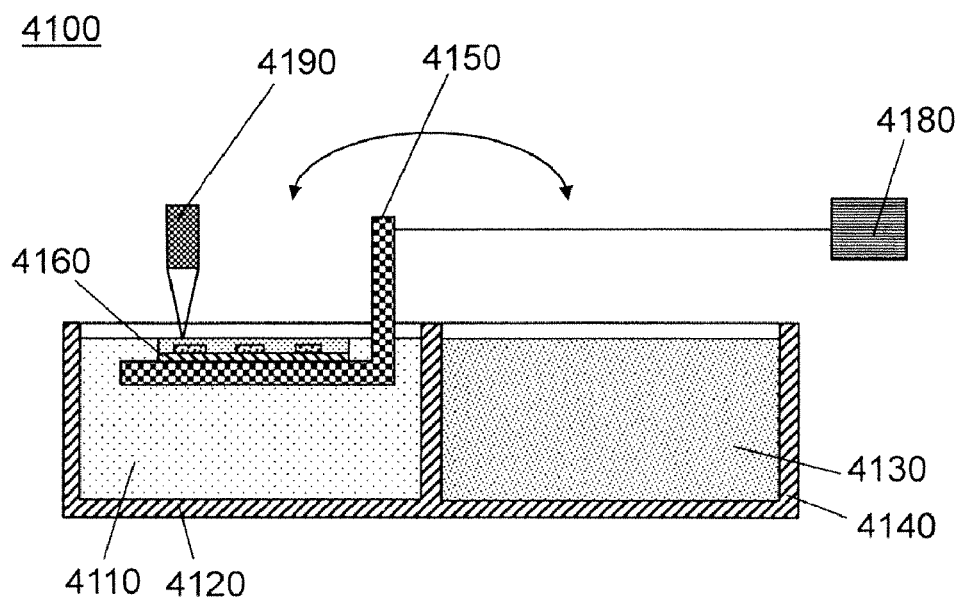
FIG. 30 is a sectional view schematically showing a manufacturing apparatus of wiring board in the conventional art.
Figure 31A:
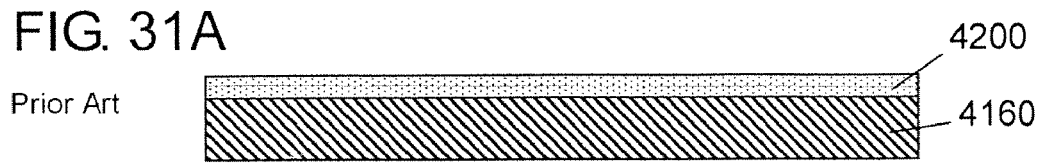
FIG. 31A is a sectional view explaining the manufacturing method of the wiring board using the manufacturing apparatus in FIG. 30.
Figure 31B:
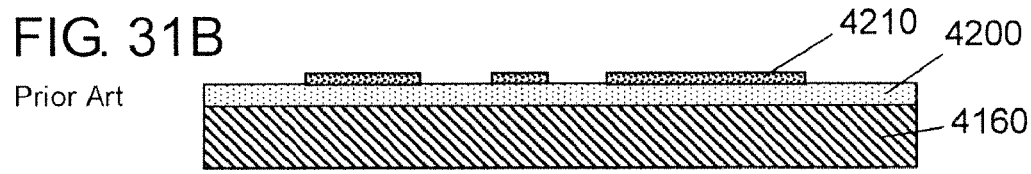
FIG. 31B is a sectional view explaining the manufacturing method of the wiring board using the manufacturing apparatus in FIG. 30.
Figure 31C:
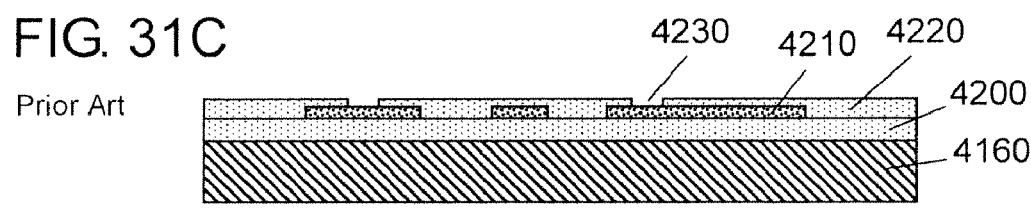
FIG. 31C is a sectional view explaining the manufacturing method of the wiring board using the manufacturing apparatus in FIG. 30.
Figure 31D:
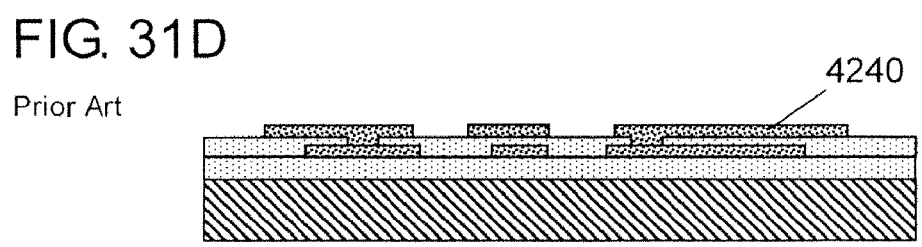
FIG. 31D is a sectional view explaining the manufacturing method of the wiring board using the manufacturing apparatus in FIG. 30.
Figure 31E:
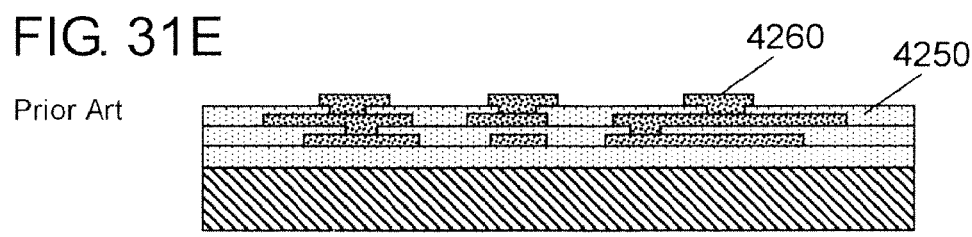
FIG. 31E is a sectional view explaining the manufacturing method of the wiring board using the manufacturing apparatus in FIG. 30.
Figure 32:
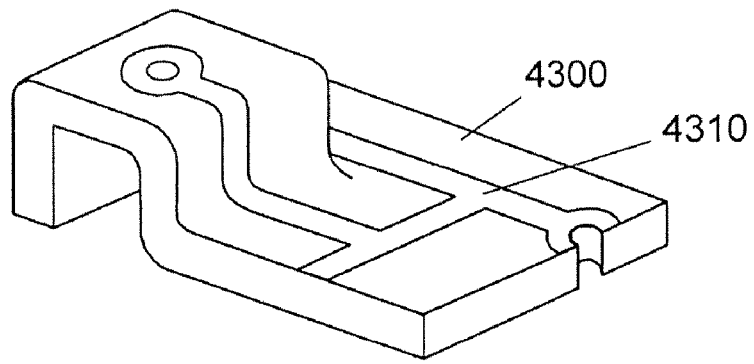
FIG. 32 is a perspective view explaining a circuit part having a three-dimensional structure of conventional art.

Referring now to FIG. 28A to FIG. 28C, a manufacturing method of the three-dimensional circuit board composed of first wiring resin group 2429 and second wiring resin 2439 is briefly described below.

First, as shown in FIG. 28A, board 2420 placed on table 2520 at least movable in Z-direction is immersed in container 2510 filled with, for example, urethane photosetting resin 2500.

On photosetting resin 2500 covering board 2420, mask 2550 having opening 2540 in a specified pattern formed of a metal or the like for shielding at least ultraviolet light or visible light is placed. Through opening 2540 of mask 2550, irradiation light 2530 emitted from, for example, a light irradiation device (not shown) is emitted to photosetting resin 2500 on board 2420. As a result, for example, through mask 2550 having opening 2540 in a pattern shape of first-step first wiring resin 2431, on board 2420, first-step first wiring resin 2431 is formed in batch in specified thickness. The specified thickness is 1 μm to 100 μm, for example, in the case of wiring pattern, and the thickness can be adjusted freely by the intensity or illumination time of irradiation light 2530. At this time, it is preferred to eliminate effects of diffraction light generated by opening 2540 of mask 2550. Hence, a steeper sectional shape pattern can be formed.

The light irradiation device or photosetting resin 2500 may be same as in the eighth preferred embodiment.

Next, as shown in FIG. 28B and FIG. 28C, by moving table 2520 sequentially in Z-direction, photosetting resin 2500 is cured while sequentially exchanging masks 2550 having pattern 2540 in a specified pattern corresponding to first wiring resins 2431, 2433, 2435, and second wiring resin 2439, and first wiring resin group 2429 and second wiring resin 2439 are formed.

As a result, a three-dimensional wiring resin group as shown in FIG. 27B is formed in photosetting resin 2500.

Herein, table 2520 is moved corresponding to exchange of masks 2550 as described below. For example, depending on the thickness of each step of first wiring resin group 2429 or the altitude (thickness) of second wiring resin 2439, the moving extent of table 2520 is controlled by control device 2560, in consideration of intensity of irradiation light 2530, illumination time, and characteristics of photosetting resin 2500.

Consequently, as explained by referring to FIG. 20A to FIG. 20E and FIG. 21A to FIG. 21E in the eighth preferred embodiment, the shape of the opening of the mask, and the three-dimensional wiring resin group having the shape of the opening of the mask formed on the board are formed.

In the explanation above, the wiring resin group is formed by exchanging the masks, but this example is not limited. For example, the liquid crystal panel may be used as the mask as explained in FIG. 23 and FIG. 24 relating to the eighth preferred embodiment.

The manufacturing method of the wiring resin group is same as that of the first wiring-electrode group, except that the photosetting resin not containing the conductive filler is used, and the explanation is omitted.

Figure 27C:
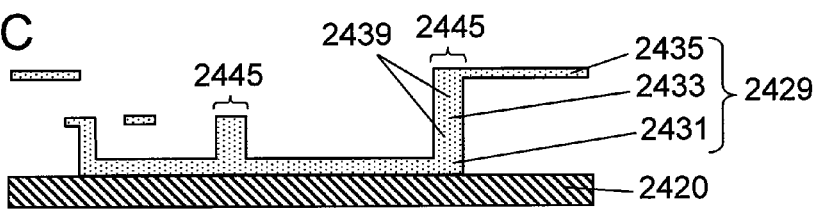
FIG. 27C is a sectional view explaining a manufacturing method of three-dimensional circuit board in the ninth preferred embodiment of the present invention.

Next, as shown in FIG. 27C, uncured photosetting resin 2500 not illuminated by irradiation light 2530 is removed, for example, by immersing in a solvent, by air blow, spin coater, or ultrasonic cleaning, and a three-dimensional wiring resin group comprising of first wiring resin group 2429 and second wiring resin 2439 is formed.

Figure 27D:
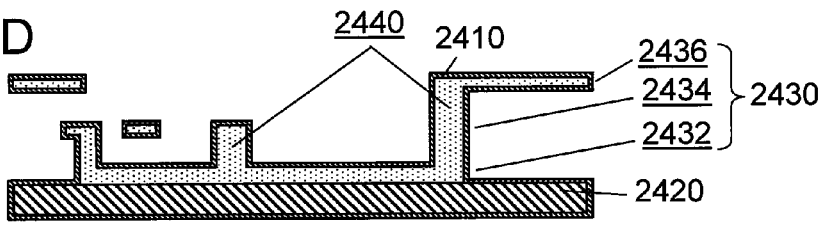
FIG. 27D is a sectional view explaining a manufacturing method of three-dimensional circuit board in the ninth preferred embodiment of the present invention.

Next, as shown in FIG. 27D, at least on the entire outer surface of first wiring resin group 2429 and second wiring resin 2439, for example by electroless plating method, metal layer 2410 of single layer film of gold, nickel, copper or silver, or laminated film of gold, nickel and copper in a film thickness of several μm to ten-odd μm is formed. The thickness of meal layer 2410 may be freely adjusted by the immersion time or temperature of plating bath.

Herein, preferably, the outer surface of first wiring resin group and second wiring resin is roughened by etching, plasma process or other method. Plasma process may be executed in vacuum or in atmosphere. Or when forming the first wiring resin group and second wiring resin by photoforming method, multiple tiny pores may be formed from the surface of first wiring resin group and second wiring resin to the inner side, and the first wiring resin group and second wiring resin may be formed in porous structure. As a result, nuclei are easily formed when forming a plating film of copper or the like as metal layer 2410, and by the bond strength of metal layer 2410 or shortening of plating time, the productivity and reliability may be enhanced. As the porous structure forming method, for example, fine particles of porous materials such as porous silica, porous silicon, zeolite, or zirconia may be added to the photosetting resin. Moreover, by mixing fine particles sublimating by heat in the photosetting resin, a porous structure may be formed by sublimation of fine particles.

In this process, first wiring-electrode group 2430 is formed of first wiring-electrode 2432 comprising of first-step first wiring resin 2431 and metal layer 2410, first wiring-electrode 2434 comprising of second-step first wiring resin 2433 and metal layer 2410, and first wiring-electrode 2436 comprising of third-step first wiring resin 2435 and metal layer 2410. Similarly, second wiring-electrode 2440 is formed of second wiring resin 2439 and metal layer 2410. Finally, a three-dimensional wiring-electrode group is formed of first wiring-electrode group 2430 and second wiring-electrode 2440.

Figure 27E:
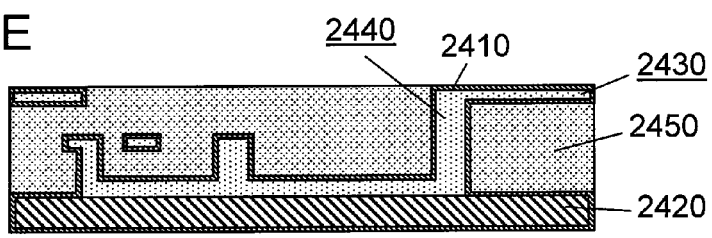
FIG. 27E is a sectional view explaining a manufacturing method of three-dimensional circuit board in the ninth preferred embodiment of the present invention.

Next, as shown in FIG. 27E, in a container (not shown) filled with liquid resin such as urethane or epoxy, at least the wiring-electrode group comprising of first wiring-electrode group 2430 and second wiring-electrode 2440 is immersed as shown in FIG. 27D. By curing by ultraviolet rays, for example, insulating layer 2450 burying first wiring-electrode group 2430 and second wiring-electrode 2440 is formed.

Insulating layer 2450 may be also formed by injecting PET resin around the wiring-electrode group, for example, by making use of capillary phenomenon.

Figure 27F:
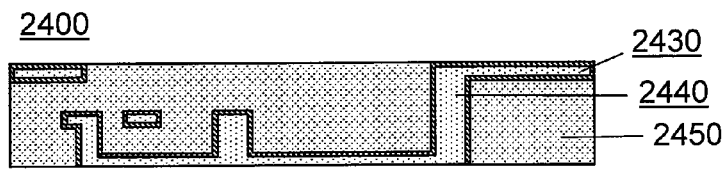
FIG. 27F is a sectional view explaining a manufacturing method of three-dimensional circuit board in the ninth preferred embodiment of the present invention.

Further, as shown in FIG. 27F, in the process in FIG. 27D, by removing board 2420 forming metal layer 2410 by polishing or other method, three-dimensional circuit board 2400 is fabricated.

According to the manufacturing method of the three-dimensional circuit board in the ninth preferred embodiment of the present invention, since the three-dimensional wiring-electrode group composed of first wiring-electrode group and second wiring-electrode connected electrically by the metal layer can be formed integrally and continuously, a manufacturing method of three-dimensional circuit board of high production efficiency is realized.

Moreover, the first wiring resin group and second wiring resin are formed continuously and integrally, and are connected electrically by the metal layer formed on the outer surface, so that a three-dimensional circuit board low in wiring resistance, excellent in high-frequency characteristics, and high in reliability is realized.

By exchange of masks or liquid crystal panel, the first wiring resin group and second wiring resin of specified pattern may be formed at desired positions. Hence, the forming positions of the first wiring resin group and second wiring resin are not limited, and a manufacturing method of high degree of freedom of design is realized.

Further, by exchange of masks and change of display pattern of liquid crystal panel, the first wiring-electrode group and second wiring-electrode are formed continuously, and interface is not formed between the first wiring-electrode group and second wiring-electrode. Hence, a three-dimensional circuit board excellent in reliability free from peeling at interface is fabricated.

Same as in the eighth preferred embodiment, since the first wiring resin group and second wiring resin are formed continuously and integrally, lands in consideration of deviation in position are not needed, and the first wiring resin group and second wiring resin can be formed at narrow pitches.

In the ninth preferred embodiment, the insulating board forming the metal layer is removed by electroless plating method, but this method is not specified. For example, a new process may be provided for adhering a new base material in order to enhance the mechanical strength and enhance the reliability against deformation. To protect the metal layer exposed on the surface after removing the board, an extra process may be provided for forming a protective layer by laminating a PET film or the like.

In the ninth preferred embodiment of the present invention, the metal layer is formed by electroless plating method, but it is not limited. For example, after forming a thin metal layer by electroless plating method, another metal layer may be formed by electrolytic plating method. As a result, a three-dimensional circuit board may be manufactured by forming the metal layer in a shorter time.

In the ninth preferred embodiment of the present invention, moreover, using the mask or the liquid crystal panel, the first wiring resin group and second wiring resin are formed continuously and integrally, but this method is not limited. For example, as explained in the first preferred embodiment, while moving the board in Z-direction, it maybe formed by scanning irradiation light such as laser in X-Y direction. As a result, a three-dimensional circuit board is manufactured by using an inexpensive apparatus.

INDUSTRIAL APPLICABILITY

The three-dimensional circuit board and its manufacturing method of the present invention are useful in the industrial fields of electronic components and electronic appliances where mounting at high density is desired, or portable information appliances where high-density wiring capable of connecting in small size and small thickness is desired.

The invention claimed is:

1. A three-dimensional circuit board comprising:
   a first wiring-electrode provided on a plurality of steps; and
   a second wiring-electrode connected to the first wiring-electrode at least in an altitude direction,
   wherein the first wiring-electrode and the second wiring-electrode are integrated continuously.

2. The three-dimensional circuit board of claim 1, wherein a metal layer is provided on an outer surface of the first wiring-electrode and the second wiring-electrode.

3. The three-dimensional circuit board of claim 1, wherein an insulating layer for burying the first wiring-electrode and the second wiring-electrode is provided at least up to a highest step of the first wiring-electrode.

4. The three-dimensional circuit board of claim 1, further comprising a substrate board on which the first and second wiring-electrodes are disposed.

5. The three-dimensional circuit board of claim 3, wherein an electronic component is mounted on at least one of the highest step and a lowest step of the first wiring-electrode.

6. The three-dimensional circuit board of claim 5, wherein a dummy electrode is provided for holding a connection electrode the first wiring-electrode, in the connection electrode for connecting only between the electronic components the first wiring-electrode having at least one free end.

7. The three-dimensional circuit board of claim 1, wherein the first wiring-electrode and the second wiring-electrode are provided at an arbitrary angle to a horizontal direction.

* * * * *